United States Patent
Robbins

(10) Patent No.: US 10,790,549 B2
(45) Date of Patent: Sep. 29, 2020

(54) METHOD FOR MANAGEMENT OF ENERGY STORAGE SYSTEMS, AND RELATED METHOD OF OPERATION FOR SMART ENERGY STORAGE CELLS

(71) Applicant: Sunfield Semiconductor, Inc., Calabasas, CA (US)

(72) Inventor: Steven Andrew Robbins, Calabasas, CA (US)

(73) Assignee: Sunfield Semiconductor Inc., Calabasas, CA (US)

( * ) Notice: Subject to any disclaimer, the term of this patent is extended or adjusted under 35 U.S.C. 154(b) by 74 days.

(21) Appl. No.: 16/172,583

(22) Filed: Oct. 26, 2018

(65) Prior Publication Data

US 2019/0131802 A1  May 2, 2019

Related U.S. Application Data

(60) Provisional application No. 62/577,558, filed on Oct. 26, 2017.

(51) Int. Cl.
*H01M 10/42* (2006.01)
*H04W 16/18* (2009.01)
(Continued)

(52) U.S. Cl.
CPC ...... *H01M 10/4257* (2013.01); *G01R 31/396* (2019.01); *H02J 7/0013* (2013.01);
(Continued)

(58) Field of Classification Search
CPC ....... H04W 4/80; H04W 16/18; H04W 88/02; H04W 28/14; H04W 4/02; H04W 88/00;
(Continued)

(56) References Cited

U.S. PATENT DOCUMENTS

| | | | | |
|---|---|---|---|---|
| 4,534,401 A | * | 8/1985 | Schaumburg | B22D 25/04 164/102 |
| 6,108,524 A | * | 8/2000 | Hershey | H04B 7/06 455/101 |

(Continued)

*Primary Examiner* — Helen Rossoshek

(57) ABSTRACT

A method of managing an energy storage system that includes a plurality of smart energy storage cells, and a related method of operation for said smart cells. The cells are arranged into a two-dimensional array, and at least one management unit for controlling and monitoring the smart cells is coupled to the array. The smart cells and management units engage in wireless communication that has relatively short range and is relatively directional, with the direction being electronically-steerable in the plane of the array. The management method assigns direction codes to each smart cell which the cells utilize to steer the directions of their communication links, thereby organizing the smart cells into a plurality of serially-linked communication networks. The methods include steps for automatically determining the size and arrangement of the array, including the orientation of each smart cell. The methods also include steps for automatically reorganizing the network links in response to any cell or management unit failing to communicate, thereby making the energy storage system highly fault-tolerant and extremely reliable.

30 Claims, 12 Drawing Sheets

(51) Int. Cl.
*G01R 31/396* (2019.01)
*H02J 7/00* (2006.01)
*H02J 7/02* (2016.01)
*H04B 5/00* (2006.01)

(52) U.S. Cl.
CPC .......... *H02J 7/0014* (2013.01); *H02J 7/0016* (2013.01); *H02J 7/025* (2013.01); *H04B 5/0012* (2013.01); *H04B 5/0031* (2013.01); *H04W 16/18* (2013.01); *H01M 2010/4278* (2013.01); *H02J 7/00302* (2020.01); *H02J 7/00306* (2020.01)

(58) Field of Classification Search
CPC .. H04B 5/0031; H04B 5/0012; G01R 31/374; G01R 31/364; G01R 31/396; G01R 31/36; G01R 31/3835; G01R 31/3644; H02J 7/0013; H02J 2007/0067; H02J 7/0047; H02J 50/80; H02J 7/025; H02J 7/0026; H02J 7/0014; H02J 7/0016; H02J 7/007; H02J 7/00; H02J 7/0021; H02J 7/00306; H02J 7/00302; H02J 7/0048; H02J 7/0049; H02J 7/007192; H02J 13/0003; H01M 10/4257; H01M 2010/4278
See application file for complete search history.

(56) References Cited

U.S. PATENT DOCUMENTS

| | | | |
|---|---|---|---|
| 7,598,880 B2 | 10/2009 | Powell et al. | |
| 7,667,429 B2* | 2/2010 | Little | H02J 7/00047 320/106 |
| 7,774,151 B2 | 8/2010 | Bertness | |
| 7,807,289 B2* | 10/2010 | Seiler | H01M 2/1022 429/158 |
| 8,310,201 B1* | 11/2012 | Wright | G08C 17/02 320/108 |
| 8,563,152 B2 | 10/2013 | Morita et al. | |
| 8,670,799 B2* | 3/2014 | Pattenden | H02J 7/00038 455/557 |
| 8,820,626 B2* | 9/2014 | Rich | H01M 10/48 235/375 |
| 8,914,173 B2* | 12/2014 | Biondo | B60L 1/003 701/22 |
| 9,203,118 B2 | 1/2015 | Lenz et al. | |
| 9,197,079 B2* | 11/2015 | Yip | H02J 7/0045 |
| 9,293,935 B2 | 3/2016 | Lee et al. | |
| 9,455,581 B2* | 9/2016 | Wey | H01M 10/4207 |
| 9,667,091 B2 | 5/2017 | Baek et al. | |
| 9,696,383 B2* | 7/2017 | Kikuchi | H01M 10/441 |
| 9,825,474 B2* | 11/2017 | Tohara | H01M 10/441 |
| 9,966,766 B2* | 5/2018 | Adest | H02J 7/00036 |
| 10,204,535 B2* | 2/2019 | Yamazaki | G09G 3/20 |
| 10,587,134 B2* | 3/2020 | Kondo | H01M 2/1016 |
| 2003/0181168 A1* | 9/2003 | Herrod | G06F 1/1626 455/90.3 |
| 2005/0083021 A1 | 4/2005 | Mahon | |
| 2007/0046261 A1* | 3/2007 | Porebski | G01R 31/3648 320/132 |
| 2009/0033277 A1* | 2/2009 | Ludtke | H01M 10/54 320/106 |
| 2010/0156355 A1* | 6/2010 | Bauerle | B60L 53/305 320/145 |
| 2010/0188092 A1* | 7/2010 | Sekizaki | H01M 10/48 324/427 |
| 2011/0256428 A1* | 10/2011 | Ho | H01M 2/105 429/7 |
| 2013/0278220 A1* | 10/2013 | Cao | H01M 10/4257 320/134 |
| 2013/0320768 A1 | 12/2013 | Fujimatsu et al. | |
| 2014/0312848 A1* | 10/2014 | Alexander | H02J 3/14 320/134 |
| 2015/0149015 A1* | 5/2015 | Nakano | B60L 53/65 701/22 |
| 2015/0188334 A1* | 7/2015 | Dao | H02J 7/00 320/107 |
| 2016/0006085 A1* | 1/2016 | Toya | H02J 7/0045 429/90 |
| 2016/0087685 A1* | 3/2016 | Brumley | H02J 7/0063 320/136 |
| 2016/0109931 A1* | 4/2016 | Kobayashi | G06F 1/3265 345/212 |
| 2016/0240903 A1* | 8/2016 | Kossakovski | H01M 10/6572 |
| 2017/0040796 A1* | 2/2017 | Jousse | H02J 7/0047 |
| 2017/0108553 A1* | 4/2017 | Ganesan | H02J 7/0021 |
| 2017/0117725 A1* | 4/2017 | Hendricks | H01M 10/486 |
| 2017/0308623 A1* | 10/2017 | Cox | G06F 30/20 |
| 2018/0010919 A1* | 1/2018 | Huang | H01M 10/4257 |
| 2018/0041072 A1* | 2/2018 | Clifton | H02J 3/32 |
| 2018/0120386 A1* | 5/2018 | Riemer | H01M 6/505 |
| 2018/0262894 A1* | 9/2018 | Daoura | H04L 67/02 |
| 2018/0289531 A1* | 10/2018 | Thomas | A61F 7/02 |
| 2019/0036178 A1* | 1/2019 | Karner | G06F 3/0484 |
| 2019/0086913 A1* | 3/2019 | Sugaya | G05D 1/0033 |
| 2019/0131814 A1* | 5/2019 | Robbins | H04W 16/18 |
| 2019/0296310 A1* | 9/2019 | Newman | H01M 2/206 |
| 2019/0359076 A1* | 11/2019 | Nakano | B60L 53/80 |
| 2020/0050200 A1* | 2/2020 | Torii | B64F 1/36 |
| 2020/0076214 A1* | 3/2020 | Mifsud | H02J 7/0045 |

* cited by examiner

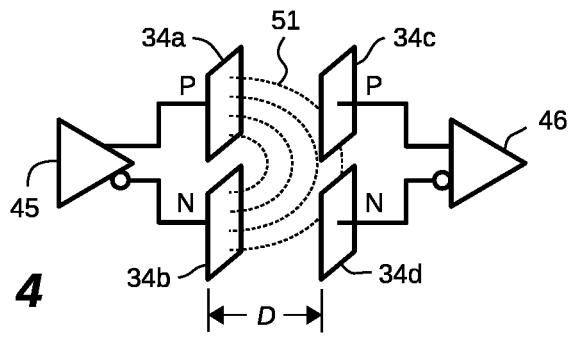
FIG. 4
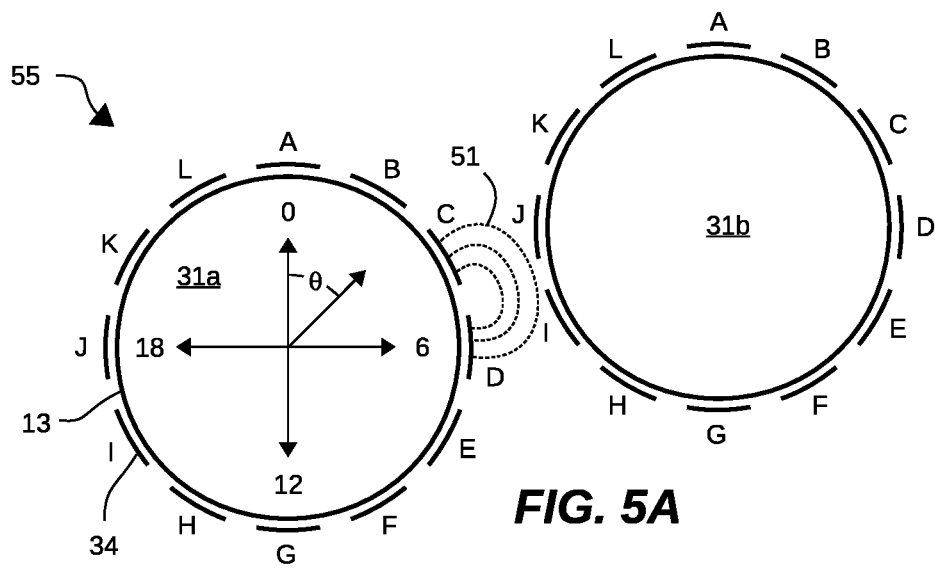
FIG. 5A
| Direction Code | θ (Deg) | Plates P | Plates N | Direction Code | θ (Deg) | Plates P | Plates N |
|---|---|---|---|---|---|---|---|
| 0 | 0 | L | B | 12 | 180 | F | H |
| 1 | 15 | A | B | 13 | 195 | G | H |
| 2 | 30 | A | C | 14 | 210 | G | I |
| 3 | 45 | B | C | 15 | 225 | H | I |
| 4 | 60 | B | D | 16 | 240 | H | J |
| 5 | 75 | C | D | 17 | 255 | I | J |
| 6 | 90 | C | E | 18 | 270 | I | K |
| 7 | 105 | D | E | 19 | 285 | J | K |
| 8 | 120 | D | F | 20 | 300 | J | L |
| 9 | 135 | E | F | 21 | 315 | K | L |
| 10 | 150 | E | G | 22 | 330 | K | A |
| 11 | 165 | F | G | 23 | 345 | L | A |
FIG. 5B

METHOD FOR MANAGEMENT OF ENERGY STORAGE SYSTEMS, AND RELATED METHOD OF OPERATION FOR SMART ENERGY STORAGE CELLS

BACKGROUND OF THE INVENTION

The present invention relates generally to the field of electrical energy storage, and more specifically to the field of managing energy storage systems to maximize performance and avoid damage by over-charging or over-discharging the cells.

Energy storage systems come in a variety of sizes and shapes, but almost always include a plurality of energy storage devices. Batteries are the most common type of energy storage device, but supercapacitors are gaining popularity because they offer a number of advantages over batteries, such as faster charging and higher peak discharge currents.

A key challenge when designing an energy storage system is assuring safety and reliability and one aspect of this challenge is assuring that none of the energy storage devices in the system are ever over-charged, or over-discharged. Therefore, every multi-device energy storage system requires monitoring the State of Charge (SoC) of every energy storage device, and terminating the charging or discharging when the SoC for any device exceeds predetermined limits.

FIG. 1 is a high-level block diagram of an energy storage system 10 that includes a positive terminal 11 and a negative terminal 12; a plurality of energy storage devices 13 serially-connected between the terminals; and a conventional management circuit 14 coupled to the energy storage devices via a plurality of wires 15. The management circuit 14 typically includes: a plurality of differential amplifiers 16 each disposed to sense the voltage across one of the energy storage devices and produce a proportional output voltage that is referenced to the negative terminal 12; a multiplexer 17 for selecting one of the differential amplifiers' outputs; an analog-to-digital converter 18 with a voltage reference 19 for measuring the selected voltage; a network interface 20 for communication with an external charge controller and/or load; and a control circuit 21—typically a microcontroller with memory—for at least controlling the multiplexer, acquiring measurements from the ADC, and communicating via the network interface. The system 10 typically also includes at least one temperature sensor 22 coupled to the multiplexer for monitoring the temperature of at least one of the energy storage devices.

The basic management process for a conventional system such as the energy storage system 10 typically includes steps of: collecting data related to the voltage across each energy storage device and typically the temperature of at least one energy storage device; estimating the SoC for each energy storage device based on the collected data; communicating with an external charge controller to terminate the charging process in response to the estimated SoC for at least one energy storage device rising above a predetermined upper limit; and typically communicating with an external charge controller and/or load to terminate discharging in response to the estimated SoC for at least one energy storage device falling below a predetermined lower limit.

Additionally, a conventional system such as the energy storage system 10 typically includes charge balancing. Charge balancing is necessary because no two energy storage devices are exactly alike; they always have slightly different energy storage capacities, which leads to imbalances. For example, when the energy storage system 10 reaches the End of Discharge (EoD) state, some devices may still have as much as 15% energy remaining, while others may have as little as 5%. Unless the energy storage devices are periodically rebalanced to equal charge states this mismatch, or imbalance, increases with every charge/discharge cycle.

One charge balancing technique is called active balancing, but it is not often used because it is relatively complex and expensive. Passive balancing is the most common technique, and typically just requires a resistor 23 and an electronically-controlled switch 24 for each energy storage device, as shown in FIG. 1.

Thus, the management process for the conventional energy storage system 10 typically also includes the step of passively balancing the energy storage devices while the system is charging. The devices that have the most stored energy at the start of the charging process have their switches 24 closed, thereby allowing some of the charging current to go around them via the parallel-connected resistor 23. This slows the charging rate of these devices, giving the other devices—the ones with the lower initial state—time to catch up. Ideally, all the energy storage devices reach 100% SoC nearly simultaneously, then the switches 24 are all opened and the charging current is terminated.

The conventional management circuit 14 has a number of known disadvantages including relative inflexibility, relatively high cost, relatively low reliability, and susceptibility to common-mode noise.

A wireless management system can potentially overcome all of these disadvantages. In a wireless system, each energy storage device is replaced by a smart cell, and a central management unit talks to all the smart cells via some type of wireless communication network. For example, system reliability is improved by eliminating the wires 15 and thereby eliminating all failure modes associated with the wires. And system reliability is further improved by redundancy since each smart cell has its own data acquisition circuitry, thereby eliminating the possibility of the whole system failing because of a single-point failure in the multiplexer 17, ADC 18, or reference 19.

However, despite these potential advantages, wireless monitoring is still not widely used in energy storage systems, primarily because of technical challenges associated with radio communications. Radio works extremely well for long range communication, but often is not well suited for extremely short distances—commonly referred to as the near field—especially when there are a large number of transceivers packed into a relatively small metal enclosure, such as an array of batteries inside an electric vehicle.

Virtually all wireless monitoring systems attempt to overcome these challenges by using one of the various radio protocols defined under IEEE standard 802.15 (e.g., Bluetooth, and ZigBee). These protocols attempt to deal with the issues associated with densely packed transceivers by utilizing a large number of frequency channels (typically at least sixteen) and a lot of relatively complex rules for deciding which frequency channels each cell uses, and when they can transmit.

Unfortunately, these techniques are not always sufficient. Wireless monitoring systems could be improved by utilizing alternative media (i.e., other than radio) that is better suited to such environments. But any such approach entails the need for a new protocol.

There exists, therefore a need in the art for a wireless communication protocol that is well suited for environments where very large numbers of smart energy storage cells are densely packed, and communicate via media other than radio.

SUMMARY OF THE INVENTION

The methods disclosed herein may generally include managing an electrical energy storage system having a plurality of smart cells and operating said smart cells. The smart cells are arranged into a two-dimensional array, and at least one management unit is coupled to the array for controlling and monitoring the smart cells. Each smart cell includes an energy storage device and may produce data at least related to its energy storage state. Moreover, each smart cell may be configured for relatively directional short-range wireless communication, wherein the direction may be electronically-steerable in a plane of the array.

The method of managing the energy storage system may include steps of: organizing the smart cells into a plurality of chains; and operating the system with a repetitive loop that includes: collecting data from the cells in each chain, and analyzing the data to determine the overall status of the energy storage system. A chain is a serially-linked communication network of smart cells with a first end designated as the 'top' and a second end designated as the 'bottom', and the top cell in each chain is in communication with a management unit. Each smart cell may include a mode setting with at least a link state and a termination state. The bottom cell in each chain may have its mode set to operate as a termination cell, and all other cells (i.e., those between the management unit and termination cell) may have their modes set to operate as links cells. Every smart cell may be assigned an up-direction code for sending and receiving information along the chain in the direction of the management unit. Additionally, all the link cells may be assigned a down-direction code for sending and receiving information along the chain in the direction of the termination cell.

The organizing step may include a floor planning step and an implementation step. A fixed or initial floor plan may be predetermined and programmed into the nonvolatile memory of at least one management unit. The floor plan may also be determined or modified by a process that includes: discovering cells within the communication range of the termination cell; mapping the discovered cells into the floor plan and selecting a cell for addition to the chains; and concatenation where the selected cell becomes the new termination and the old termination becomes a link cell.

The collecting data step may include: each link cell sending its data up the chain, and then conveying data from all down-chain cells up the chain. The termination cell may only send its own data up the chain because there are no cells further down the chain than the termination cell.

The smart cells may also be addressed individually. For example, the smart cells may include circuitry for active balancing, and said balancing circuitry can be turned on or off in selected cells. The addressing process begins when a management unit sends an address and an associated command down one of its chains. Each link cell that receives an address that is not equal to a predetermined value responds by updating the address by adding a predetermined offset, and then forwards the updated address and command down the chain. Eventually, a cell receives an address equal to the predetermined value, and in response the cell executes the associated command.

The methods may also include provisions for determining the lengths of the chains. For example, the termination cell begins by sending a predetermined initial cell count up the chain. Each link cell updates the cell count by adding a predetermined offset, then passes that offset up the chain. The final cell count received by the management unit represents the length of the chain.

Lastly, the methods may also include provisions for recovering from hardware failures. When a smart cell or management devices stops communicating for a predetermined time limit the recovery process may exit from the operating loop, remove the uncommunicative device from the floor plan, produce a modified floor plan where the chains go around the failed device, and then implement a new floor plan before returning to the operating loop.

BRIEF DESCRIPTION OF THE DRAWINGS

The accompanying drawings illustrate the invention. In such drawings:

FIG. 4 is a simplified schematic diagram showing two smart cells communicating with each other via capacitive coupling;

FIG. 5A is a top view of an array having two smart cells in communication with each other via capacitive coupling;

FIG. 5B is a table showing how the communication is electronically-steerable in the plane of the array;

DETAILED DESCRIPTION OF THE PREFERRED EMBODIMENTS

Figure 1:
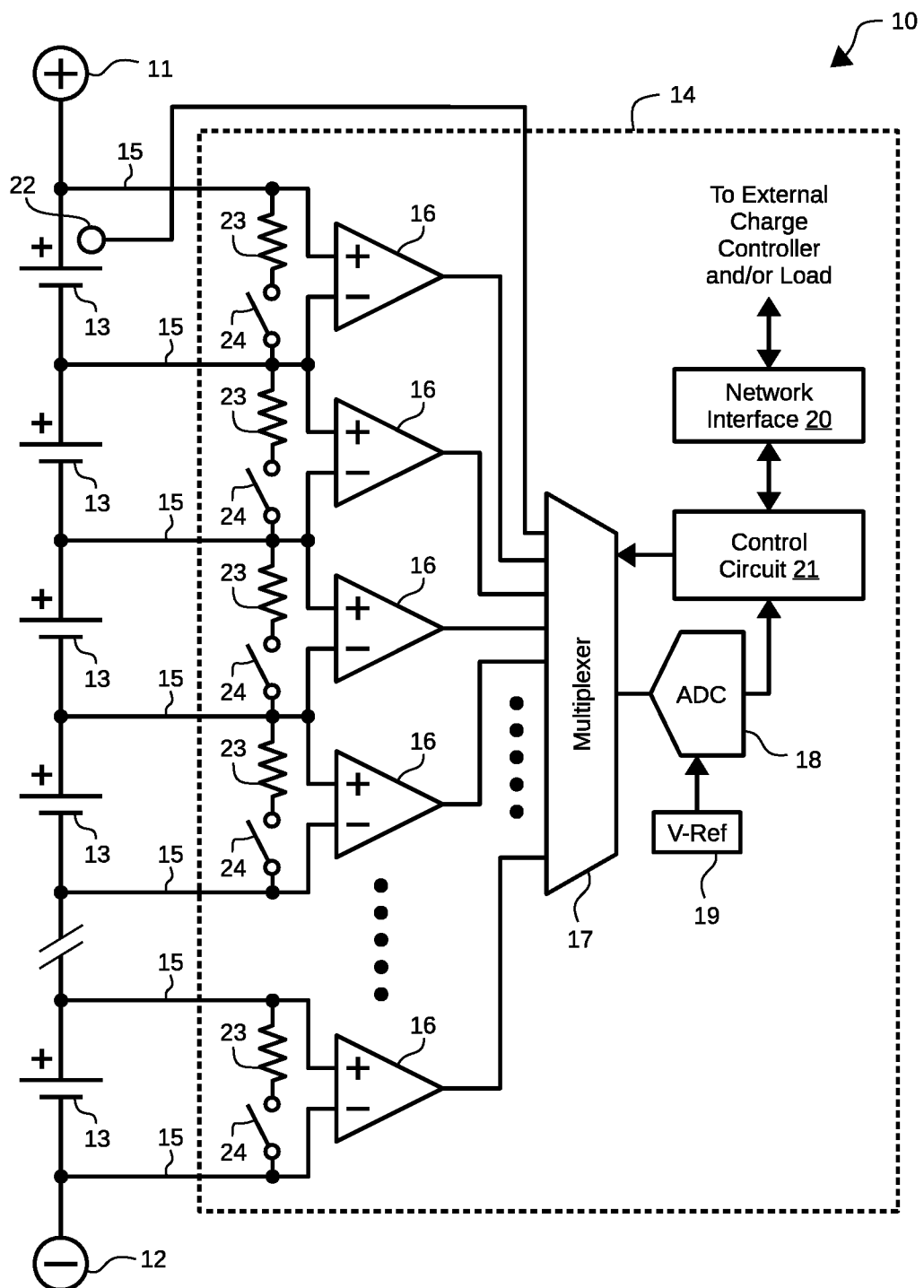
FIG. 1 is a high-level block diagram of a prior art energy storage system.
Figure 2:
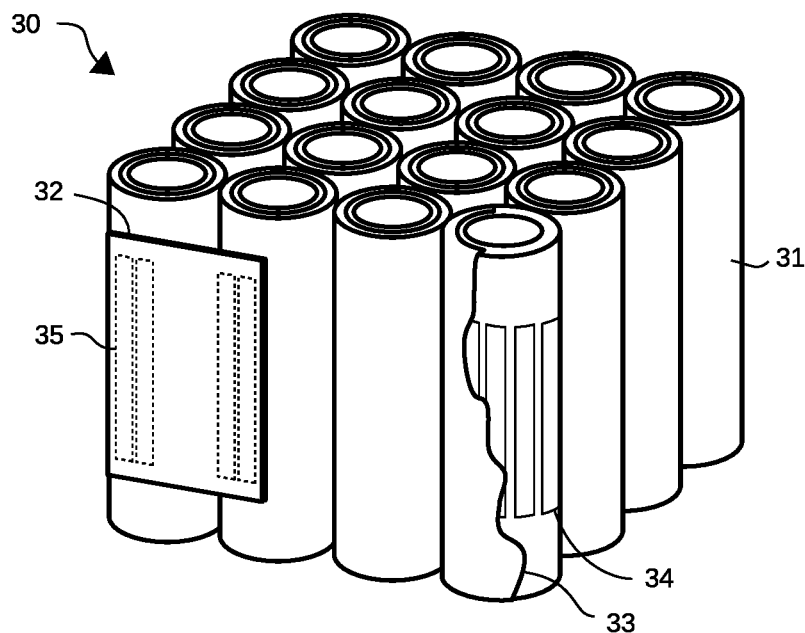
FIG. 2 is an isometric view of an exemplary energy storage system including smart cells.
Figure 3:
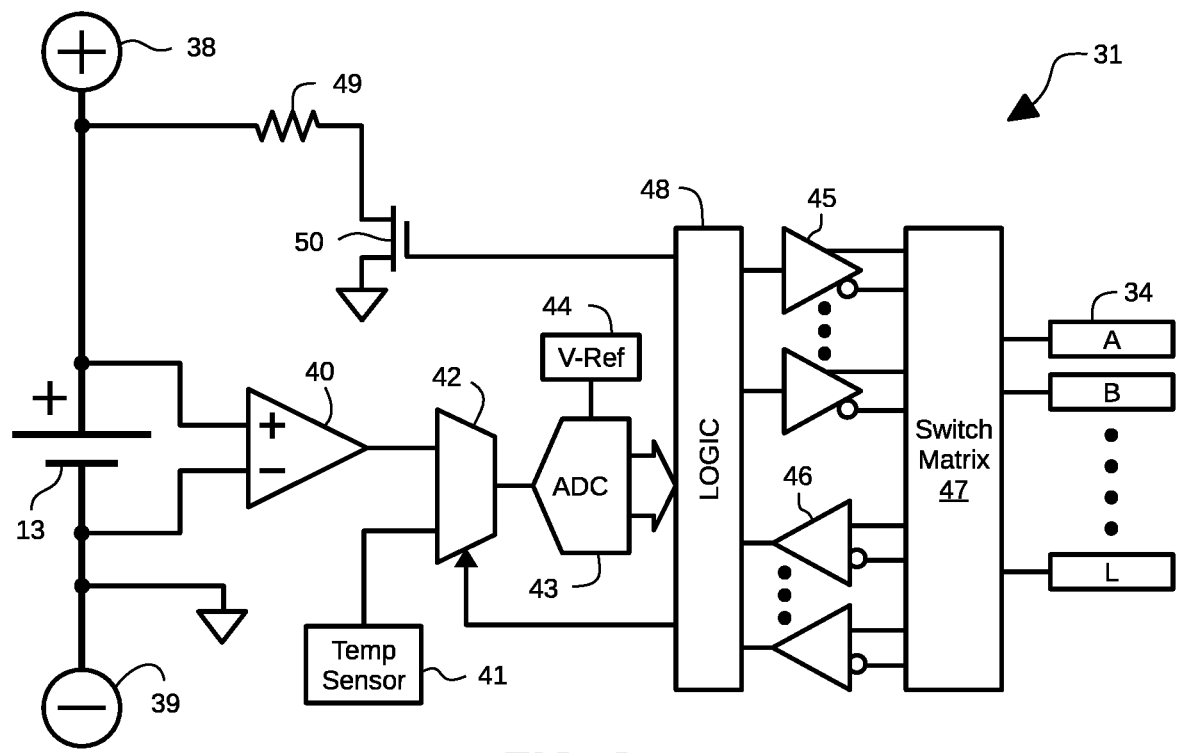
FIG. 3 is a is high-level block diagram of a smart cell.

FIG. 2 is an isometric view of an energy storage system 30 having a plurality of smart cells 31 arranged into a two-dimensional array with at least one Distributed Management Unit (DMU) 32 for controlling and monitoring the smart cells. FIG. 3 is a high-level block diagram of one of the smart cells 31 including an energy storage device 13 coupled to positive terminal 38 and a negative terminal 39, data acquisition circuitry for producing data related to the state of the energy storage device, and communication circuitry for engaging in relatively short range wireless communication that is relatively directional and electronically-steerable in the two-dimensional plane of the array. As disclosed herein, the schematic symbol for a battery is used in a general way to represent any type of electrical energy storage device. For example, the energy storage device 13 could be a battery, a capacitor, or any combination of batteries and capacitors.

The data acquisition circuitry for producing data related to the energy storage state may generally include a differential amplifier 40 for sensing and scaling the voltage across the energy storage device 13, a temperature sensor 41 for sensing the temperature of the energy storage device, a multiplexer 42 for selecting the output signal of either the differential amplifier 40 or temperature sensor 41, an analog-to-digital converter 43 and voltage reference 44 for measuring the output voltage of the multiplexer.

The communication circuitry for engaging in short range wireless communication may generally include at least one driver 45 for transmitting data, at least one receiver 46 for receiving data, a plurality of conductive plates 34 surrounding the energy storage device in the two-dimensional plain for communicating via capacitive coupling, and a switch matrix 47 for selectively connecting the conductive plates to the drivers and receivers. FIG. 3 illustrates twelve plates 34 labeled 'A' through 'L'. Twelve plates may be typical for cylindrical-shaped smart cells that could be randomly rotated during assembly of the array, but the smart cell 31 could use fewer plates if the cell rotations are not random, or more plates if higher angular resolution is desired.

Additionally, FIG. 2 shows that the conductive plates 34 on each smart cell 31 are covered by an electrically insulating layer 33 to prevent direct electrical contact between the plates of any two adjacent smart cells, and the DMU 32 has its own set of conductive plates 35 for communicating with at least one of the smart cells 31 via a capacitive coupling.

FIG. 4 is a simplified schematic showing the basic concept of wireless communication via the capacitive coupling and that its extremely short range is typically less than 3 mm. In this example, the differential driver circuit 45 is connected to two conductive plates 34a, 34b and a differential receiver circuit 46 is connected to two more plates, 34c, 34d. The differential driver 45 is typically just a digital output driver with complementary outputs that is used in many integrated circuits. When the first plate 34a is driven high, the other plate 34b is driven low, and vise versa. The voltage difference between the two plates 34a, 34b creates electric field flux lines 51 between and around them. FIG. 4 shows only some of these flux lines. The second pair of plates 34c, 34d are close to the plates 34a, 34b and well within the electric field 51, so there is typically at least 50 mV of potential therebetween. The differential receiver circuit 46 is typically just an ordinary voltage comparator that amplifies this small potential by a factor of at least a few thousand. Note that if the distance D increases to more than about 3 mm, the potential between plates 34c, 34d becomes too small to overcome the hysteresis and the output of the receiver 46 will be flat.

This form of communication—capacitive coupling via a plurality of selectable plates—is relatively directional. For example, FIG. 5A is a top view of an array 55 of two smart cells 31a, 31b that are in communication, where each smart cell has twelve (to be consistent with FIG. 3) conductive plates 34 surrounding the energy storage device 13 in the plain of the array. The first cell 31a uses its C/D plates for transmitting, while the second cell 31b uses I/j plates for receiving. This works because the two pairs of plates face each other, as in FIG. 4. But the communication link would be broken if, for example, the second cell 31b used plates E/F instead, because they are not facing plates C/D on the first cell 31a.

Furthermore, FIG. 5B is a table showing how the direction of communication is steerable around the plane of the array. A digital direction code determines which two plates are selected, thereby setting the direction of communication θ. For example, in FIG. 5A the first cell 31a uses a direction code=5)(θ=75° while the second cell 31b uses a direction code=17)(θ=255°. Note that P and N correspond to the plates in FIG. 4.

Capacitive coupling is not the only possible form of communication that is directional and electronically-steerable in the plane of the array. For example, one could theoretically make smart cells that communicate via magnetic fields instead of electric fields by replacing conductive plates with small coils. Alternatively, one could make smart cells that communicate optically by replacing the conductive plates with light-emitting diodes and photoelectric sensors. But in each case the method for managing the energy storage system and the related method of operation for the smart cell would be generally the same.

Any number of smart cells can be configured to form a chain by setting their direction codes. A chain is a serially-linked communication network of smart cells with a first end designated as the 'top' and a second end designated as the 'bottom', and the top cell in each chain is in communication with a management unit. Furthermore, each smart cell includes a mode setting with at least a link state and a termination state. The bottom cell in each chain has its mode set to operate as a termination cell, and all other cells (those between the management unit and termination cell) have their modes set to operate as link cells. Link and termination cells are physically identical, but their behavior is somewhat different, as described below in relation to FIGS. 10,14-15, and 18A-20B.

Figure 6:
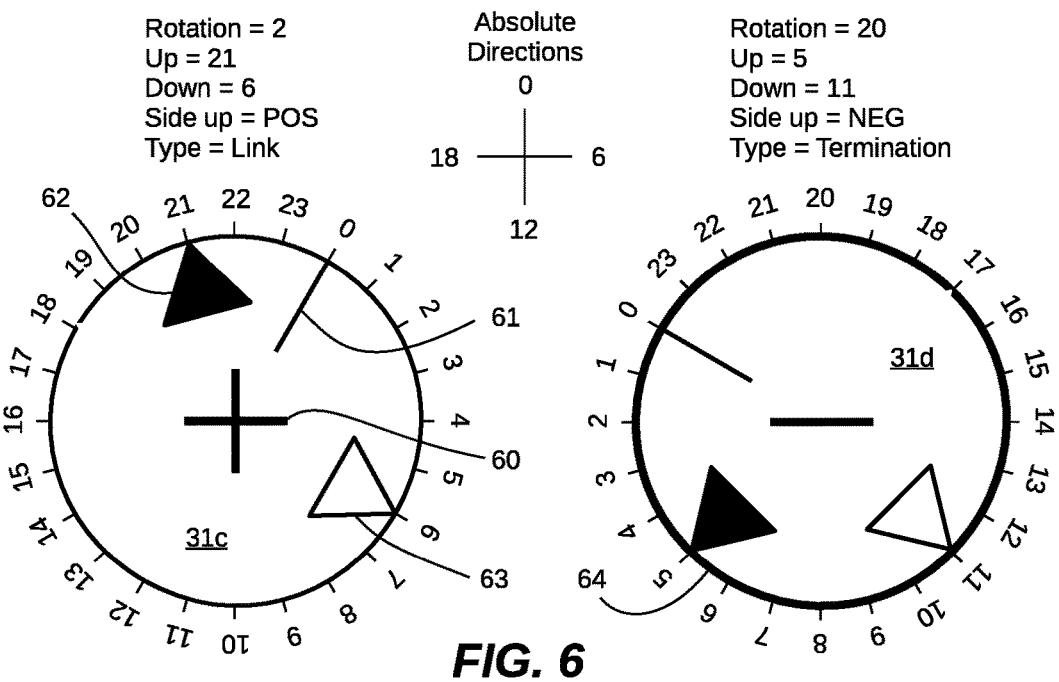
FIG. 6 is top views of two smart cells including symbols indicating the rotation and orientation of the cells with respect to the array, and the up and down direction settings.
Figures 7A, 7B:
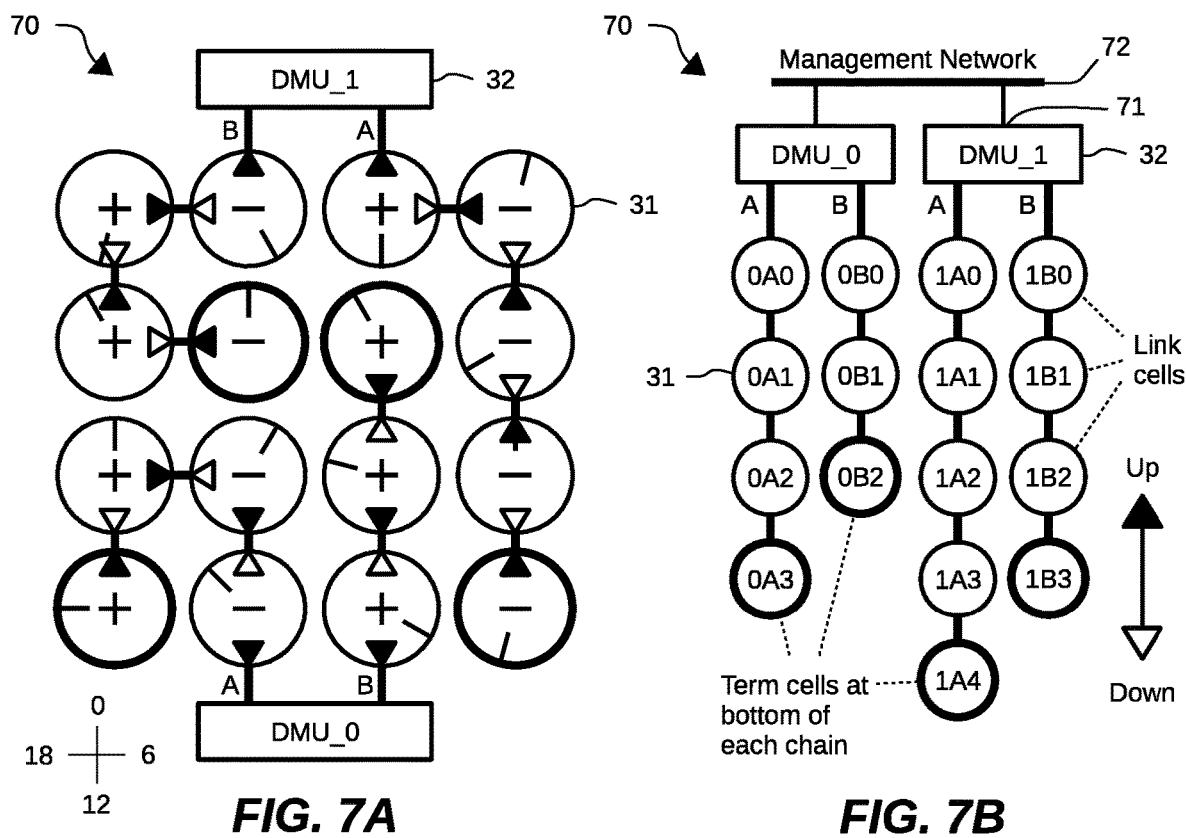
FIG. 7A is a top view of a energy storage system including two management units and a 4×4 array of smart cells organized into four chains.
FIG. 7B is a high-level network diagram of the system in FIG. 7A.

FIGS. 6-7B show more details of the chains. First, FIG. 6 is a top view of two smart cells 31c, 31d with special symbolic notations added. The absolute, or true directions (upper middle of FIG. 6) apply to the entire array, while the up and down directions for each individual cell are relative, because they depend on the rotation of the cell. A polarity mark 60 ('+' or '-') at the center of each cell indicates its orientation. For example, the cell 31c is oriented with its positive side facing up. A rotation mark 61 shows how each cell is rotated relative to the true directions. For example, the cell 31c is rotated two counts clockwise, so its rotation=2. Notably, the rotation depends on the orientation of the cell. For example, the cell 31d has direction codes that run counter-clockwise because the cell orientation is flipped (negative side up). Next, two arrows 62-63 indicate the relative direction codes a cell uses when communicating up or down the chain. Finally, the outline 64 of the cell indicates the cell mode, for example: the cell 31c is a link cell and therefore drawn with a plain outline; and the cell 31d is a termination cell and therefore drawn with a bold outline.

FIG. 7A applies these cell notations to show how the chains work. FIG. 7A is a top view of an energy storage system 70 that includes sixteen smart cells 31 arranged into a 4×4 array, with two management units 32, and FIG. 7B is the corresponding high-level network diagram. The lines connecting the smart cells to each other and the management units represent the capacitive communication links that serially-connect the cells into chains. In FIG. 7A, the chains bend in places so that they can cover all the cells. But, in FIG. 7A, the chains are laid out in straight vertical lines for clarity.

The system 70 works as a whole because of network aggregation. Each chain is a linear communication network independent of the other chains, but each DMU 32 includes a network interface 71 and the plurality of DMUs communicate with each other via a management network 72. Therefore, the DMUs are able to work cooperatively to manage all the chains. Optionally, a computer may be connected to the management network to at least provide a user interface.

FIG. 7B shows where the 'up' and 'down' conventions come from. For any given cell, the 'up' direction is whatever direction it uses to send data along the chain toward the management unit, and 'down' is the direction it uses to send data along the chain toward the termination cell.

Figure 17:
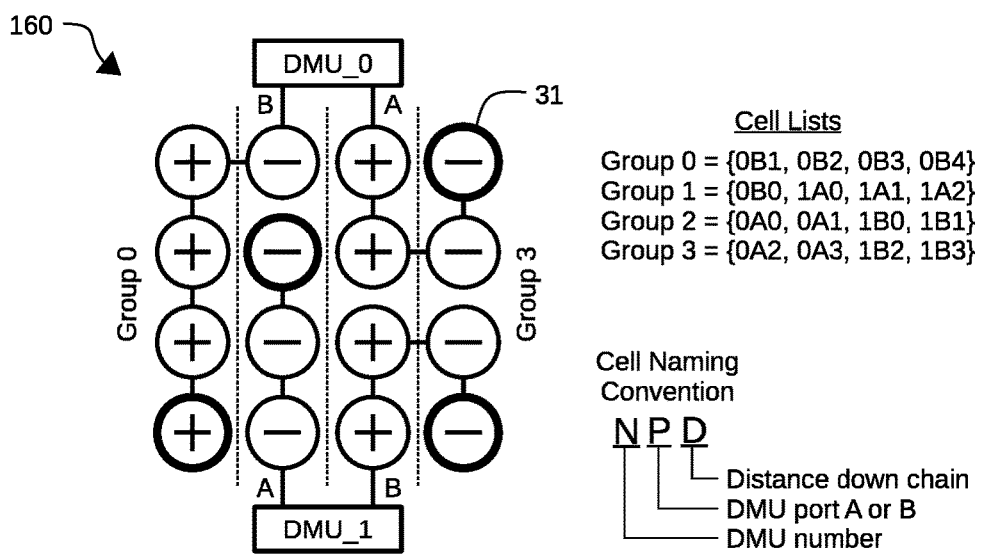
FIG. 17 is a top view of the system in FIG. 16 with the smart cells assigned to groups.

FIG. 7B also introduces a 3-digit convention for designating the smart cells that is used again below in regard to FIG. 17. The first digit (on the left) indicates which DMU is in control of the chain that includes the cell. Since there are only two DMUs in the system 70, the first digit is either '0' or '1'. The middle digit indicates the DMU port; in this example each DMU has only two ports (A and B) but they could have more. The third digit (on the right) indicates how far down the chain the particular cell is. For chains longer than ten cells, this could be a 2-digit number. For example, "0A2" means: the chain in communication with port A of DMU_0, and two cells down from the top of the chain.

Figure 8:
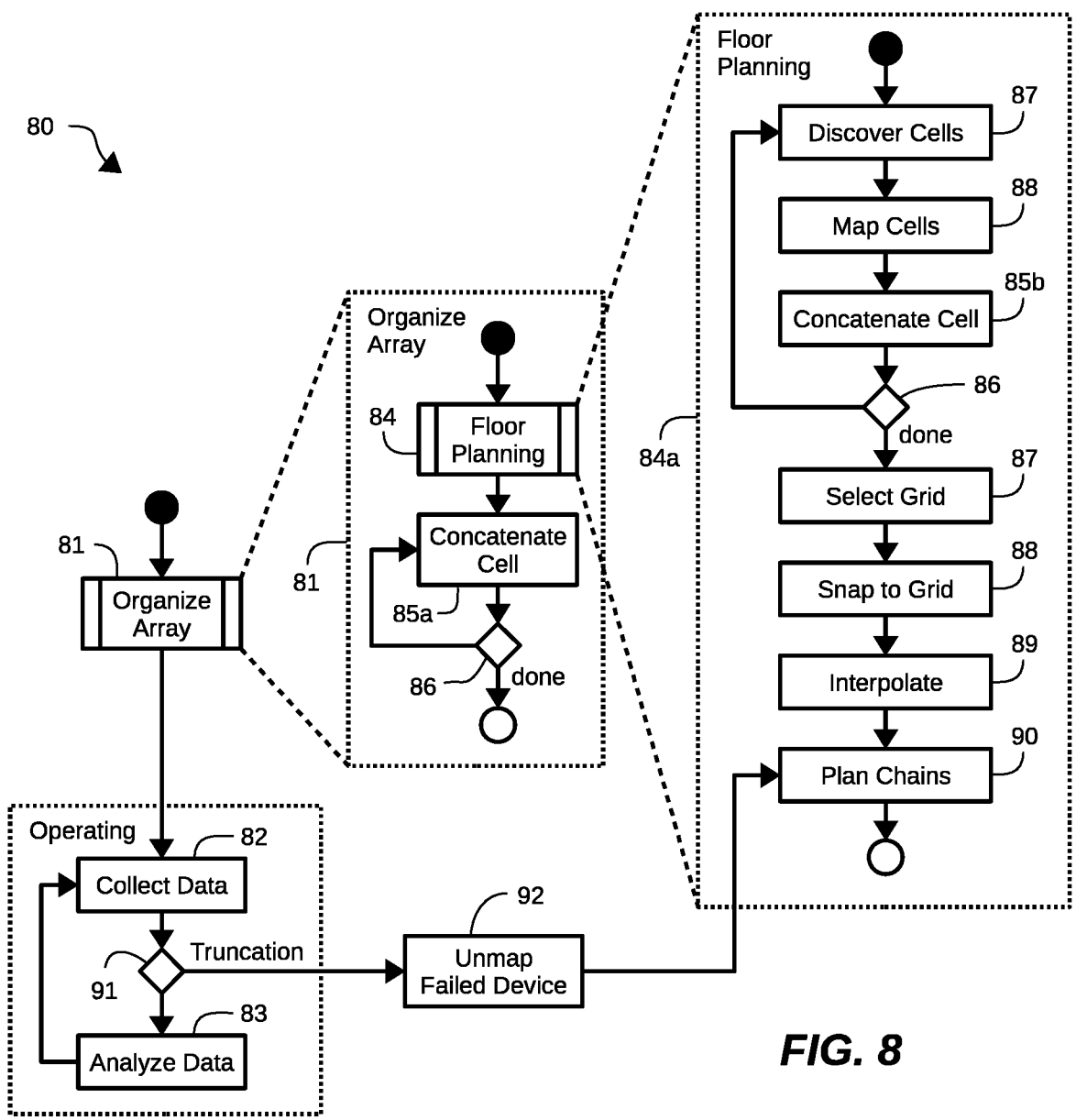
FIG. 8 is a high-level flow diagram of an energy storage system management method as disclosed herein.

FIG. 8 is a high-level flow diagram of the method 80 for energy storage system management including: an organizing step 81 wherein the smart cells are organized into chains so they can communicate with the DMUs; and an operating loop that runs repetitively. The operating loop may include: collecting 82 data from the plurality of smart cells related to their energy storage state; and analyzing 83 the collected data.

The organizing step 81 may include steps of: floor planning 84 and implementation. Floor planning may produce a map of the array with each smart cell assigned to a chain. Implementation is where the chains are built according to the floor plan by concatenating 85a one smart cell at a time until a decision 86 to stop when all the cells are included in the chains.

The floor planning step 84 may include optional steps of: predetermining an initial floor plan; programming the predetermined floor plan into a nonvolatile memory in at least one DMU; and then reading the predetermined floor plan from the nonvolatile memory when the array is assembled. If the cells are randomly rotated during the assembly process, then the up and down direction codes can't be predetermined, and the predetermined floor plan would be incomplete. In such cases the up and down directions would typically be determined by the implementation loop (85a-86).

Usually the floor plan is constructed after the array is assembled by an exploration process 84a that starts with a loop that includes: discovering 87 cells that are within the extremely short communication range of the termination cell; mapping 88 the discovered cells and selecting one of them for concatenation; and concatenating 85b the selected cell that subsequently becomes the new termination cell.

Figure 9A:
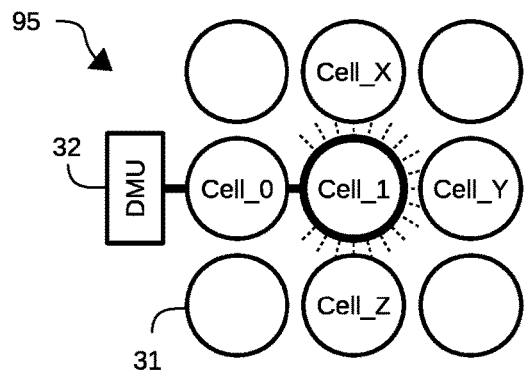
FIG. 9A is a top view of an energy storage system including a single management unit and a 3×3 array of smart cells, wherein the center cell is performing the cell discovery step.
Figure 9B:
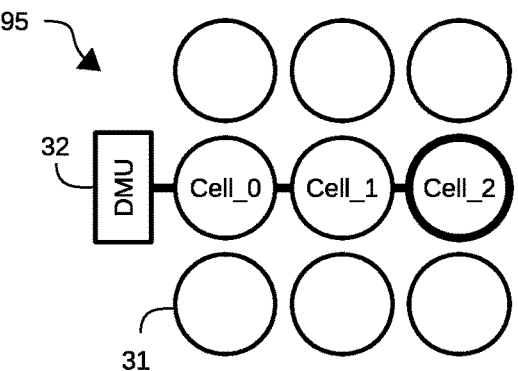
FIG. 9B is a top view of the system from FIG. 8A wherein a third cell has been added to the chain via a concatenation step.

FIGS. 9A-B show how this works. FIGS. 9A-B are top views of an energy storage system 95 that includes nine smart cells 31 arranged into a 3×3 array, with one management unit 32. FIG. 9A is the initial state where the system has a single chain with just two cells (Cell_0, and Cell_1) and is about to add a third cell to the chain. First, the termination (Cell_1) performs the discovering step 87; the dashed lines represent the plurality of directions the termination cell uses to search for in-range cells. In this case, Cell_1 discovers three cells that are arbitrarily named X,Y, and Z. The other cells in the corners of the array are too far away for Cell_1 to discover.) Cell_1 reports the direction of each discovered cell back to the DMU 32 via Cell_0. Then the DMU chooses which cell to add the chain—in this example it chooses Cell_Y—and sends a concatenate command to Cell_1 along with a direction code pointing to Cell_Y. FIG. 9B shows the final state after the concatenating step 85b. Cell_2 (previously Cell_Y) is now the new termination cell, as signified by its bold outline, and Cell_1 is now a link cell.

Figure 10:
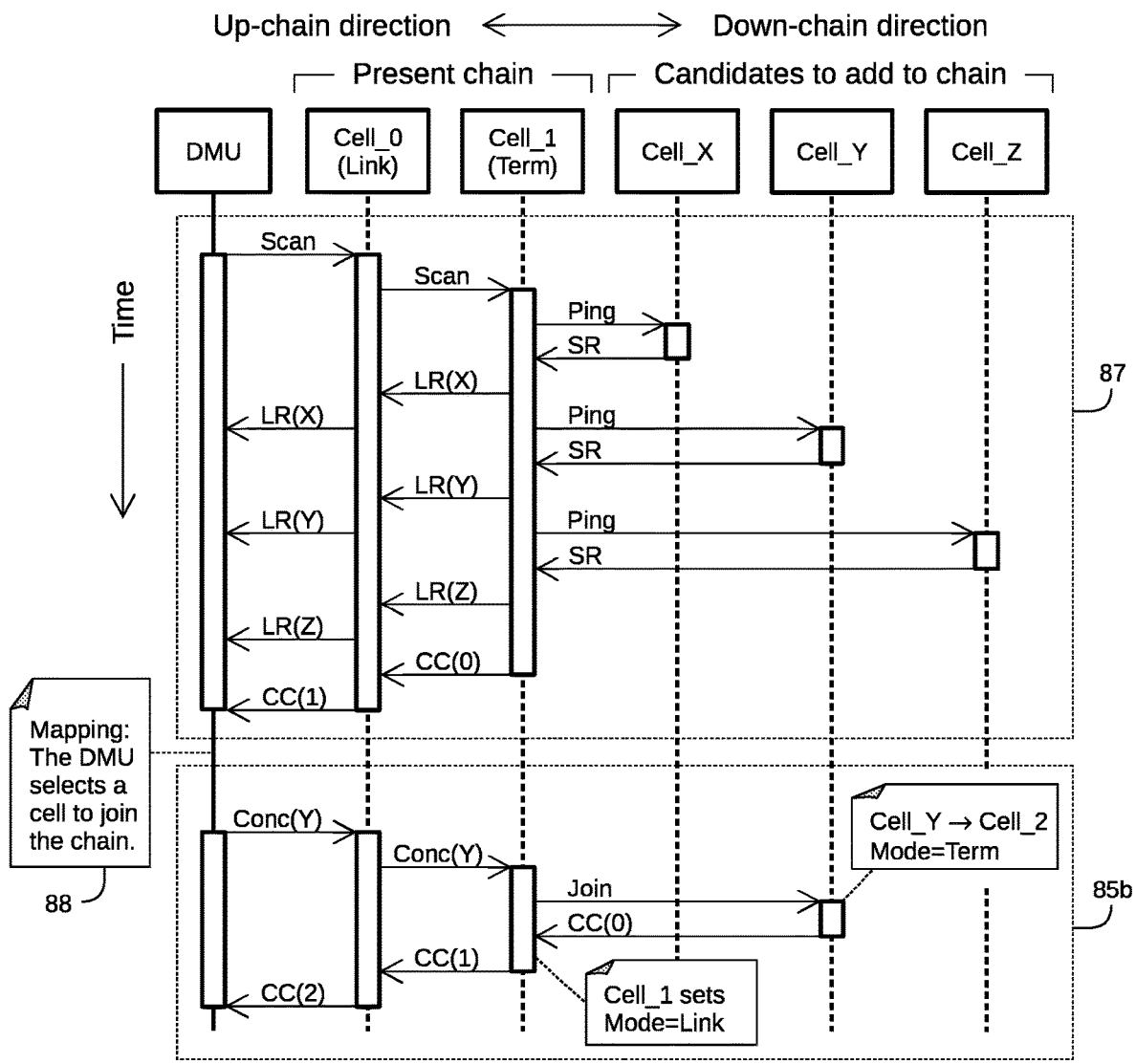
FIG. 10 is a sequence diagram including additional details of the cell discovery and concatenation steps.

FIG. 10 is a sequence diagram showing more details of the discovering 87 and concatenating 85b steps. Sequence diagrams are part of the Universal Modeling Language (UML) widely used in the field of software engineering. Briefly, the rectangles across the top (DMU to Cell_Z) are the objects that are performing activities, and the vertical lines extending down from each object are called lifelines. The tall, thin rectangles on each lifeline show when the objects are active. For example, it is typical for a smart cell to be in a low-power sleep state when not active to minimize wasting its stored energy. The horizontal arrows are communications between objects, and are shown in chronological order starting from the top and going down. As disclosed herein, all the sequence diagrams show the top of the chain on the left. In other words, communication arrows pointing to the right are moving down the chain, and communication arrows pointing to the left are moving up the chain.

The discovering step 87 begins when the DMU sends a scan command (upper left corner of FIG. 10) down the chain. The scan command is always intended for the termination cell, so each link cell—in this example just Cell_0—forwards the scan command down the chain. But, after forwarding the scan command, the link cells do not go to sleep; instead they begin relaying information back up the chain.

When the termination cell (Cell_1 in this example) receives the scan command, it begins scanning its electronically-steerable communication angle in a plurality of directions (as in FIG. 9A) and in each direction attempts to discover the presence of a cell by communicating with it; for example, the termination cell begins with its electronically-steerable communication pointing in the up direction to receive the scan command, then starts the scan by rotating the direction typically about 45° clockwise, where it makes the first discovery attempt. Then it rotates the direction, typically another 15° clockwise, and makes a second attempt. The scan continues until stopping typically about 45° counter-clockwise from the up direction.

For each scan direction, the termination cell sends out a ping, which is a command telling any other cells within range to send back a Short Reply (SR). At a minimum, the SR indicates the cell is present simply by acknowledging the ping, but typically the SR also includes other information; for example, it may include data representing the 3-digit designation described above in relation to FIG. 7B. When there is no reply to a ping within a predetermined time limit, the termination cell concludes that there is no in-range cell in that direction, so it continues the scan, sending the next ping in the next direction. These time-outs are not shown in FIG. 10 for the sake of simplicity.

Each time the termination cell receives a SR, it combines it with the direction code to produce a Long Reply (LR) and it sends the LR up the chain to the DMU. For example, LR(X) represents a long reply that contains the direction code the termination cell was using when it discovered Cell_X. And as stated above, the link cells (in this example just Cell_0) are waiting to receive each LR and pass it up the chain. This is shown in FIG. 10: first Cell_0 receives LR(X) and passes it up the chain; then Cell_0 receives LR(Y) and passes it up the chain; and finally Cell_0 receives LR(Z) and passes it up the chain.

After the termination cell has scanned all directions, it typically completes the discovery process by initiating a cell count. (The cell count process is optional, but is shown in all the sequence diagrams.) The cell count process begins by sending a predetermined initial cell count (typically 0) up the chain; this is represented in FIG. 10 as CC(0). Each link cell receives the cell count from the down direction, updates the count by adding a predetermined offset (typically 1) to it, and then sends the updated count up the chain. The final cell count received by the management unit represents the length of the chain. For example, at the bottom of the discovering step 87 the DMU receives CC(1) indicating there are two cells in the chain at that point in time. The cell count also is one of the triggers that tells each cell when to go back into the low-power sleep state. (Another sleep-trigger is sending a SR.) For example, in FIG. 10 after the termination cell sends the predetermined initial cell count CC(0) it goes to sleep. Similarly, each link cell goes to sleep after it sends the updated cell count up the chain.

After the discovering step 87 comes the mapping step 88, wherein the DMU selects one of the discovered cells to add to the chain. To make the chain go counter-clockwise around the perimeter of the array, the DMU always selects the candidate cell that is most clockwise in relation to the up direction of the termination cell. Conversely, to make the chain go clockwise around the array's perimeter, the most counter-clockwise candidate is always chosen.

The mapping step 88 also computes the (x,y) coordinates of each discovered cell so they can be added to the floor plan of the array. First, let M be the number of plates. Therefore, the number of direction settings is 2M. (For example, FIG. 5B listed twenty four direction settings with twelve plates.) Let $u_n$ and $d_n$ be the absolute up and down directions for cell_n respectively. Let $R_n$ and $D_n$ be the relative up and down directions (the direction codes) for cell_n. Let $R_n$ be the rotation of cell_n. And let $p_n$ be the polarity, or orientation, of cell_n given by: $p_n=1$ when the positive side is up; and $p_n=-1$ when the negative side is up.

Equation 1 is for continuity. The chains are built from the top down, so equation 1 defines the absolute up direction for a new cell ($u_n$) as 180° (M direction increments) from the absolute down direction of the previous cell ($d_{n-1}$) thereby ensuring the two cells are always facing each other. FIG. 7A is an example of this, wherein each cell has its up arrow aligned with the down arrow of the next cell up the chain.

$$u_n=\mod(d_{n-1}+M, 2M) \quad\quad \text{[Equation 1]}$$

Equation 2 defines the rotation of the cell, basically by taking the difference between the absolute and relative up directions, but the cell orientation must also be taken into account.

$$R_n=\mod(u_n-p_n U_n, 2M) \quad\quad \text{[Equation 2]}$$

Equation 3 utilizes the calculated rotation to translate the relative down direction ($D_n$) to the absolute down direction ($d_n$). This also serves as the new input to equation 1 when the next cell is added to the chain.

$$d_n=\mod(R_n+p_n D_n, 2M) \quad\quad \text{[Equation 3]}$$

And finally, equations 4-6 utilize the absolute down direction and the (x,y) coordinates of the previous cell to determine the coordinates of the new cell.

$$\theta_n=\pi d_n/M \quad\quad \text{[Equation 4]}$$

$$x_n=x_{n-1}+\sin(\theta_n) \quad\quad \text{[Equation 5]}$$

$$y_n=y_{n-1}+\cos(\theta_n) \quad\quad \text{[Equation 6]}$$

After the mapping step 88 comes the concatenating step 85b, shown at the bottom of FIG. 10. This is an important step because it usually determines the up ($U_n$) and down ($D_n$) direction codes for the cells. First, the DMU sends a concatenation command down the chain with an associated direction code. In this example, Cell_Y was selected so the command is represented by Conc(Y), which means the concatenation command combined with the direction code for Cell_Y that the DMU received during the discovering step 87, contained in LR(Y). The link cells (just Cell_0 in this example) forwards the Conc(Y) command down the chain to the termination cell. The termination cell responds to the Conc(Y) command by using the received direction code to set its down direction ($D_n$), thereby pointing it toward Cell_Y when it sends a join command. Cell_Y receives the join command and in response Cell_Y: sets its up direction code ($U_n$) to the direction from which it received the join command; and changes its mode to become the new termination cell, Cell_2. And finally, the old termination (Cell_1) automatically changes its mode setting to the link state.

The concatenating step 85b typically ends with another cell count to let the DMU know the concatenation was successful. For example, in FIG. 10 the final cell count CC(2) at the end of the concatenating step 85b is greater than the count CC(1) at the end of the discovering step 87, so the DMU receives confirmation that the chain grew in length by one cell. Each new termination cell typically initiates the cell count process in response to the join command. Furthermore, the old termination cell (Cell_1 in this example) typically interprets the CC(0) cell count as an acknowledgement to the join command it sent, and in response to this acknowledgement it changes itself to a link cell.

Figure 11A:
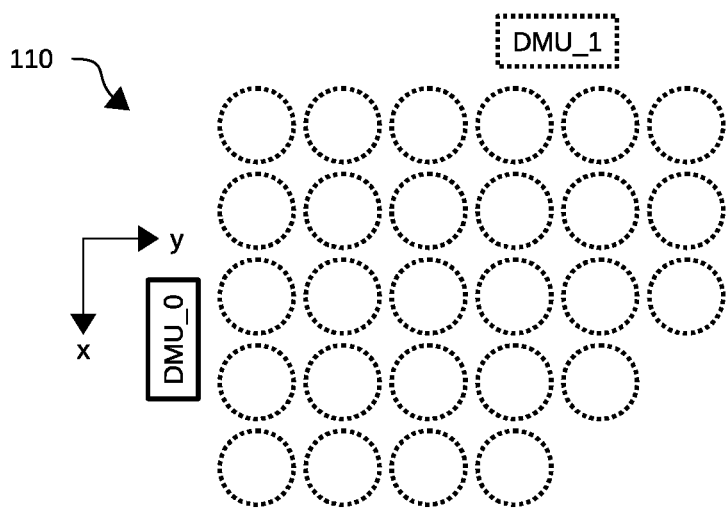
FIGS. 11A-11C are top views of an energy storage system showing various stages of a mapping process.
Figure 11B:
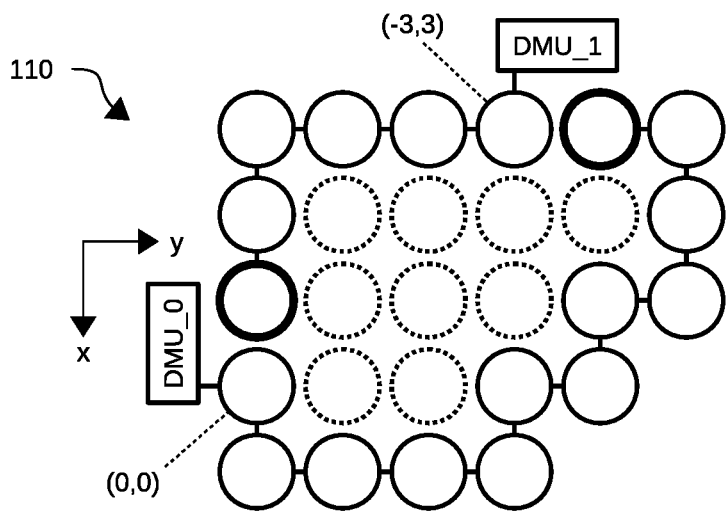
Figure 11C:
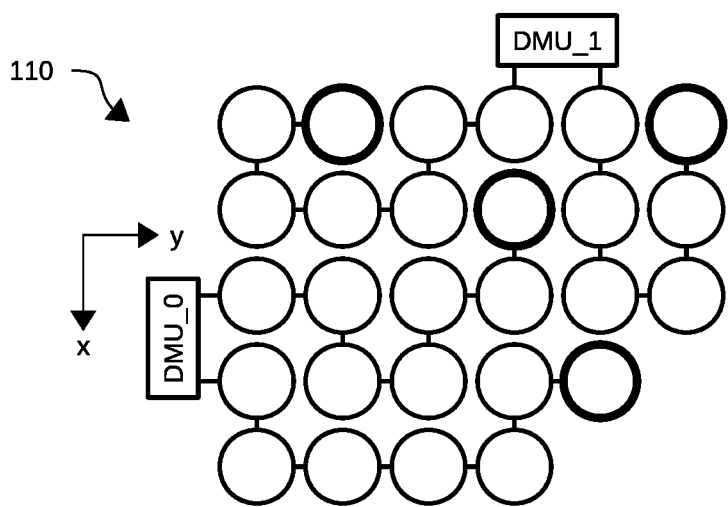

FIGS. 11A-C show an example of the floor planning step 84a. FIG. 11A is a top view of an energy storage system 110 comprising twenty seven cells in a 5×6 array with two management units. When multiple management units are present, the one with the lowest designation, DMU_0, typically begins the process. (Typically each DMU includes switches or jumpers for setting its designation.) Also, the x-y Cartesian coordinate system is typically defined by the location and orientation of DMU_0. And note that the cells are drawn with dotted lines to represent that the management units are not yet aware of the cells' existence because the system is in its initial state after assembly, before any cell discovery, mapping, or concatenation. DMU_0 and DMU_1 know of each others' existence from the start because they are in communication via the management network 72 (not shown in FIGS. 11A-C), and the coordinates of DMU_0 are defined as (0,0), but the coordinates and orientation of DMU_1 are still unknown at this stage, hence DMU_1 is also drawn with dotted lines.

The floor planning step 84a typically begins by constructing one or more chains that explore the perimeter of the array to discern its overall size and shape. FIG. 8 shows a loop that builds these chains one cell at a time by repeated cycles of discovering 87, mapping 88, and concatenating 85b until all the perimeter cells are mapped. For example, FIG. 11B is another top view of the system 110 after completing the perimeter mapping. DMU_0 built a first chain going counterclockwise around the array starting from the first cell at coordinates (0,0). The twelfth cell discovered DMU_1 and reported this back to DMBU_0. At that point, DMU_0 could have continued to build the first chain until it completely circumnavigated the array, but in this example DMU_0 handed control to DMU_1, which proceeded to build a second chain continuing counterclockwise around the array and back to DMU_0. The decision 86 to stop the loop is typically made when the termination cell discovers DMU_0 again.

Figure 12A:
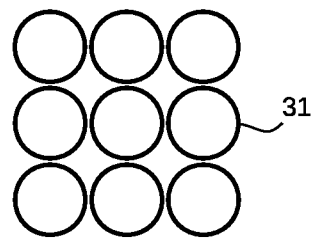
FIGS. 12A-12B are top views of two groups of smart cells showing arrangement in a rectangular array or a hexagonal array.
Figure 12B:
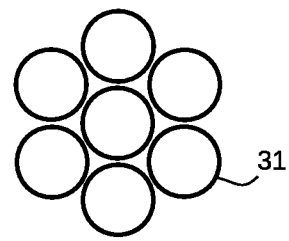
Figure 13A:
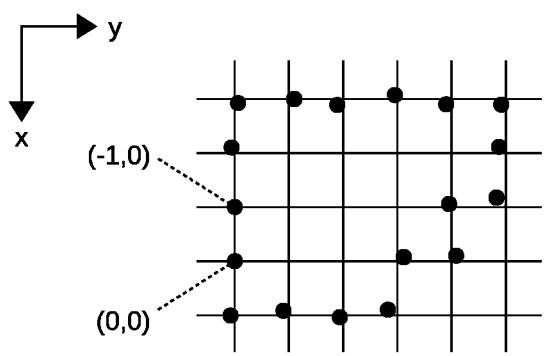
FIG. 13A is a graph with points showing the estimated locations of the perimeter cells from FIG. 11B, with a rectangular grid overlaid.
Figure 13B:
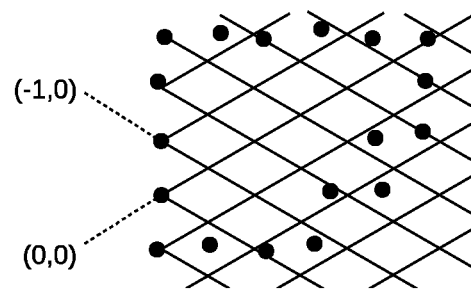
FIG. 13B is a graph with points showing the estimated locations of the perimeter cells from FIG. 11B, with a hexagonal grid overlaid.

The next step 87 in the floor planning process 84a is to select a grid. FIGS. 12A-B shows why this step is necessary. A cylindrical-shaped smart cells can be arranged into arrays that are either rectangular (FIG. 12A) or hexagonal (FIG. 12B) and the management units must decide which is the actual case. One approach for selecting the grid is the least-squares method. For example, FIGS. 13A-B are both graphs where the estimated coordinates for all the perimeter cells from FIG. 11B are plotted, and the grids show approximately where the cells should be if the array was rectangular (FIG. 13A) or hexagonal (FIG. 13B). In the least-squares method, the distance from each data point to the nearest grid position is computed, and then squared. Then all the squared-distances are summed to produce an overall error for the whole set of points. The grid that produces the lowest error sum is selected.

Figure 13C:
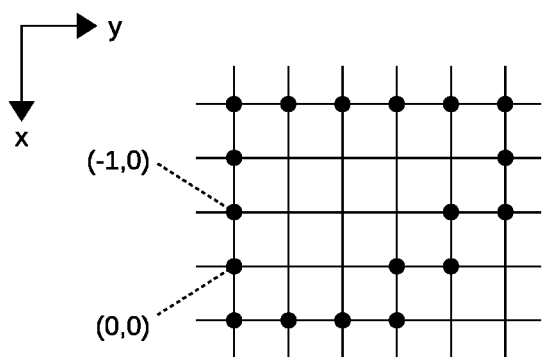
FIG. 13C is a graph with points showing the locations of the perimeter cells from FIG. 11B, snapped to the rectangular grid.

Typically the next step 88 is snapping the cell coordinates to the selected grid, as shown in FIG. 13C. This corrects for the numerical errors accumulated when the Cartesian coordinates were calculated using equations 1-7. For example, if the selected grid is rectangular, then snapping the cells to the grid is simply a matter of rounding the (x,y) coordinates to the nearest integers. This works because the units of the x and y axis are cell-spacings, not inches or millimeters. We simply assume that: the pitch (the distance from the center of one cell to the center of the next cell in the same row or column of the array) is constant for the both x and y axis; and the array is well aligned (the rows and columns are relatively straight, not crooked).

Figure 13D:
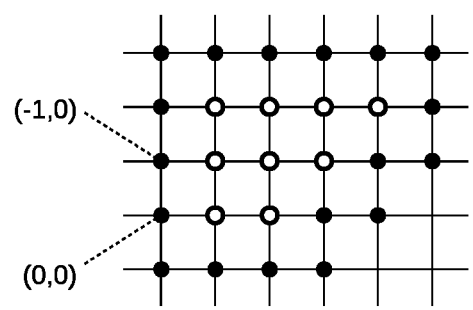
FIG. 13D is the graph from FIG. 13C with points indicating the interpolated positions of the interior cells.

The next step 89 is to use interpolation to anticipate the locations of all the unmapped interior cells (white dots in FIG. 13D) and add them to the floor plan. Alternatively, the management units could build chains that discover the interior cells, but interpolation is typically used because it's faster, and the assumption that the array is fully-populated is almost never wrong.

And typically the final step 90 in floor planning is to pre-plan the layout of chains according to a number of criteria. A first criterion is that the chains must include every cell in the array. A second criterion is that the chains must not cross each other or overlap. A third criterion is to maximize the number of chains, so each DMU manages as many chains as it can. A fourth criterion is that the chains should be approximately equal in length. And a fifth criterion is that the termination cells should be approximately evenly distributed around the array rather than being clumped together in the middle.

There are many possible methods for pre-planning the layout of the chains. One relatively simple method comprises three steps: first, divide the map into a number of zones equal to the number of available DMU ports, where all the zones include roughly equal numbers of cells; second, try to generate on chain in each zone that covers all the cells in the zone, typically by first going around the boundary of the zone and then spiraling inward; and third, if the generated floor plan does not meet all the criteria listed above, then iterate by shifting some cells between zones and trying again.

Once the floor planning step 84a is complete, the existing chains may be erased: for example, by sending a reset command to all cells. Then the chains are built by running the implementation loop that includes step 85a, adding cells to new chains in accordance with the floor plan one at a time, until at least one management unit decides 86 that all the cells have been added. FIG. 11C shows system 110 after the chains have been implemented.

Figure 14:
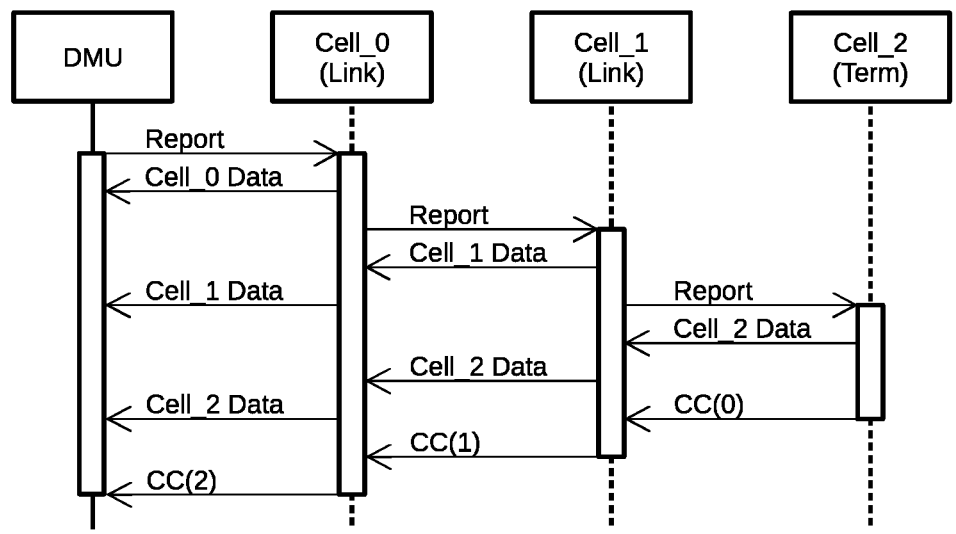
FIG. 14 is a sequence diagram of an example of the data collecting process.

Referring back to FIG. 8, when the organizing step 81 is completed by implementing the chains, the management process 80 transitions into the operating loop comprising steps of collecting 82 and analyzing 83 data from all the cells. FIG. 14 is a sequence diagram of the data collection step 82. It begins when the management unit sends the report command down the chain. In response, the first link cell (Cell_0) sends its data up-chain, forwards the report command down the chain to the next cell, and then begins relaying data from the down-chain cells up the chain. Cell_1 does the same because it is also a link cell. But the termination cell (Cell_2) only sends its own data, since there are no more cells down-chain from it. The termination cell typically also initiates the cell count process, thereby putting itself and all the link cells back to sleep.

Once again returning to FIG. 8, another key advantage of the system management method 80 is the ability to automatically recover from hardware failures. Hardware failures often can be diagnosed by analyzing the data produced by the collecting step 82. But sometimes a hardware failure may cause a cell or DMU to stop communicating, and consequently, the collecting step 82 will fail to collect all the data within a predetermined time limit. Any of these issues may cause a truncation. Truncation is essentially the opposite of concatenation, meaning failed cells are removed from a chain, making the chain shorter. The decision 91 to truncate leads to recovery by: exiting from the operating loop; removing 92 the failed device from the floor plan; planning 90 new or modified layouts for at least some of the chains; repeating the implementation loop (85a, 86) for at least the new or modified chains; and returning to the operation loop.

Figure 15:
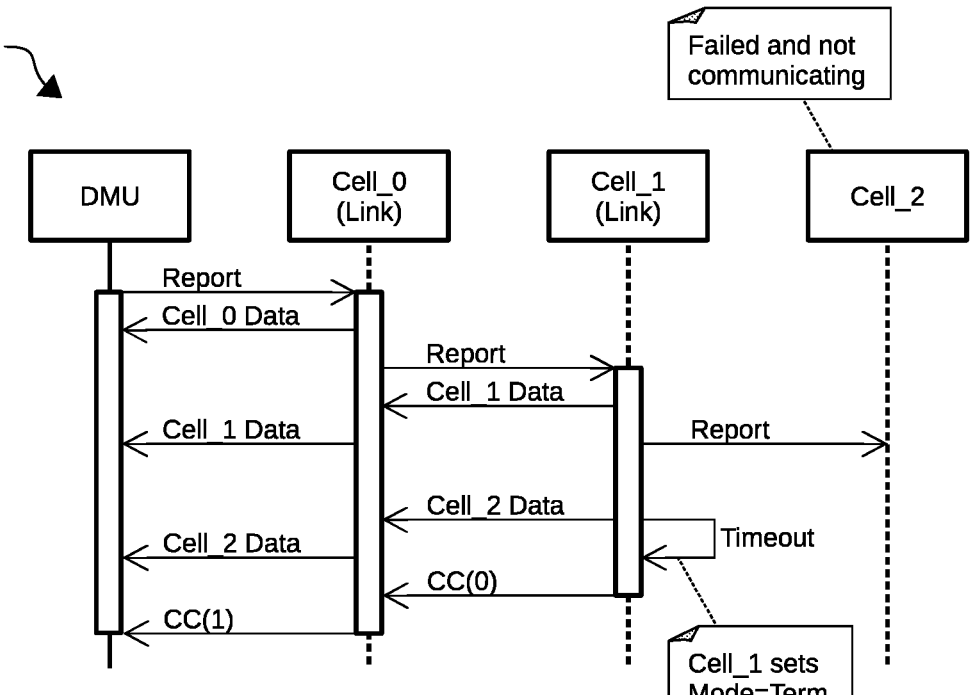
FIG. 15 is a sequence diagram of an example of the truncation process.

The cell count may be used to determine precisely which smart cell failed. For example, FIG. 15 is another sequence diagram showing the same data collection step 82 as FIG. 14, but Cell_2 has failed for some reason and no longer communicates with Cell_1. The absence of any communication from Cell_2 within a predetermined time limit causes Cell_1 to change its mode setting to become the new termination cell for the chain, thereby cutting off all the down-chain cells, including the uncommunicative cell. The new termination cell typically initiates another cell count process, and the DMU notices that the new cell count is smaller than the previous cell count, and in response it triggers the decision 91 to truncate. The unmapping step 92 utilizes the floor plan and the new cell count to determine precisely which cell failed, and then removes the failed cell from the floor plan. Consequently, the new chain layouts produced by the planning step 90 go around the failed cell.

Similarly, the management method 80 is able to automatically adapt to DMU failures. For example, if one of the DMUs fails to communicate on the management network 72 within another predetermined time limit, then all cells in all the chains controlled by the uncommunicative DMU are truncated. This again causes the decision 91 to branch to the unmapping step 92, but this time it is the failed DMU that is removed from the map, not the cells it controlled. Subsequently, the planning step 90 generates a new floor plan using only the remaining DMUs.

Figure 16:
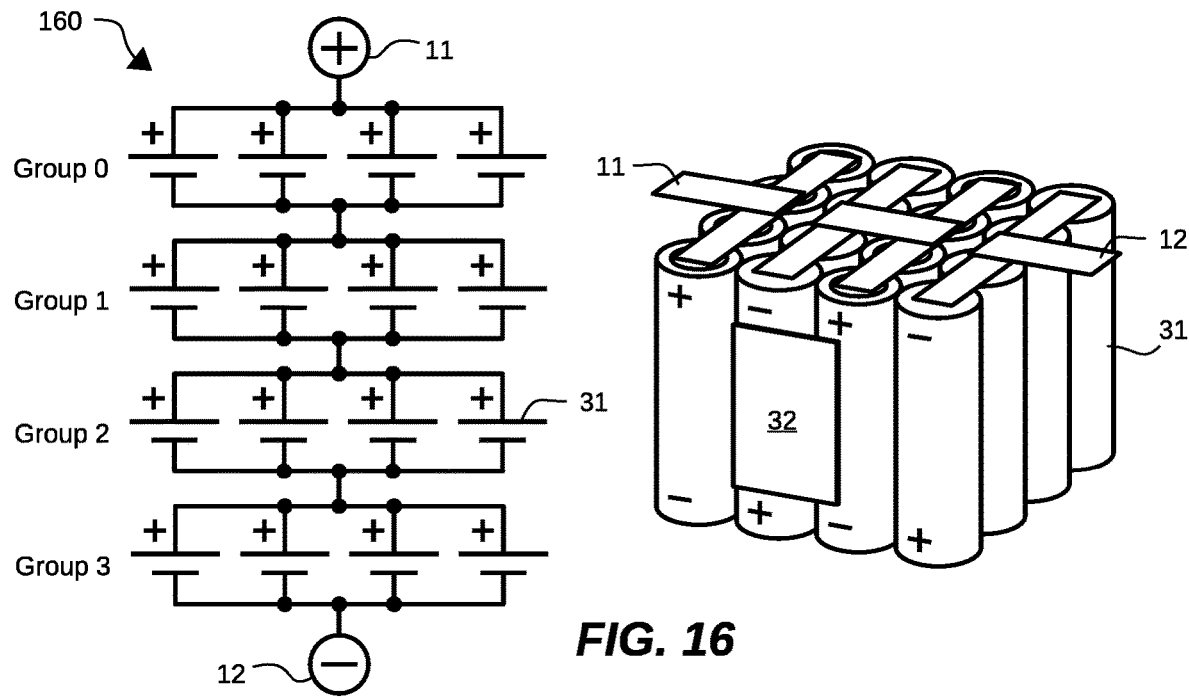
FIG. 16 is an example of an energy storage system including sixteen smart cells in a 4×4 rectangular array.

The management method 80 must also understand the electrical connections between cells in order to properly manage the system. FIG. 16 is another energy storage system 160 comprising sixteen smart cells 31 connected in a 4S4P topology, meaning four cell groups are connected in series, and each group comprises four parallel-connected cells. This connection information is essential because, without it, the management method 80 could not know how to balance the cells.

One way to provide this connection information is to preprogram it into the nonvolatile memory of at least one DMU during the manufacture of the system 160. However, a novel and advantageous feature of the method 80 is the ability to determine the connection information automatically. This ability may be useful to manufacturers who produce many different battery pack configurations in relatively small quantities; for example, a company that makes battery packs for electric bicycles.

The planning step 90 typically includes a sub-step for determining cell-to-cell connections, wherein groups of parallel-connected cells are identified. For example, FIG. 17 is a top view of the same system 160 with the chains laid out, but each cell is also labeled with its orientation ('+' or '−'). The group identification step divides the array into contiguous clusters of cells with the same orientation. The dashed lines in FIG. 17 represent the borderlines between these clusters. Such clusters of cells are almost always connected in parallel by bus bars, as in FIG. 16, so the group identification step tentatively uses them to generate cell lists (FIG. 17 upper right corner). Optionally, the cell lists can be confirmed by looking at the data obtained by the collecting step 82 because all the cells in the same group should read back the same voltage, within the expected margin of error for the data acquisition circuitry in each smart cell.

The analyzing step 83 typically sorts the data first, before any calculations. Each iteration of the data collection step 82 produces a stream of data that has an hierarchical order, typically starting with the DMU number, then the DMU port, and then the cell's distance down the chain. For example, a data set for system 160 with the chains implemented as shown, would typically be collected in the following cell order: 0A0 . . . 0A3, 0B0 . . . 0B4, 1A0 . . . 1A2, and 1B0 . . . 1B3. This data must be sorted into the order shown in the cell lists. For example, note that the cell list for Group 2 includes cells controlled by DMU_0 (0A0 and 0A1) and cells controlled by DMU_1 (1B0 and 1B1).

After sorting the data, the analyzing step 83 typically averages at least the voltage readings from all the cells in each cell list. Averaging provides at least two advantages. First, the average is typically more accurate than the individual readings by a factor of the square root of the number of cells in the list. Second, statistical outliers can be identified and excluded from the averaging. Such outliers may be the result of a random bit error, or could indicate a problem with a particular cell's data acquisition circuitry. Therefore, the management process 80 may include a step of truncating a cell if it repeatedly produces voltage data that is significantly different from the average of the other cells in the same cell group.

Next, the analyzing step 83 uses at least the average voltage reading from each cell group to estimate the SoC. But, while this is a straight forward calculation when the energy storage device is a capacitor, it can be quite difficult for batteries. For example, the discharge curve for a lithium-ion battery typically has a very small slope between about 80% and 20%, so a small drop in voltage represents a big drop in charge. Even worse, the voltage depends on the current and the internal resistance of the battery, which can change with temperature and over time. Consequently, there are no generally accepted formulas or algorithms for estimating the SoC of a battery. Instead, the industry uses a variety of schemes, many based on empirical data, and some being proprietary. Therefore, one with ordinary skill in the field of battery charging systems will know that any of these schemes could be used in the analyzing step 83.

And finally, the analyzing step typically compares the estimated SoC for each cell group against upper and lower predetermined limits. When the SoC rises above the upper limit, the system typically sends a signal to the charge controller to terminate charging. And when the SoC falls below the lower limit, the system typically sends a signal to the charge controller or load to terminate discharging.

Sometimes a DMU needs to send a command to a particular cell within a chain; for example, to turn the balancing switch 50 on or off. The system method includes two alternative processes for addressing a particular cell within a chain.

Figure 18A:
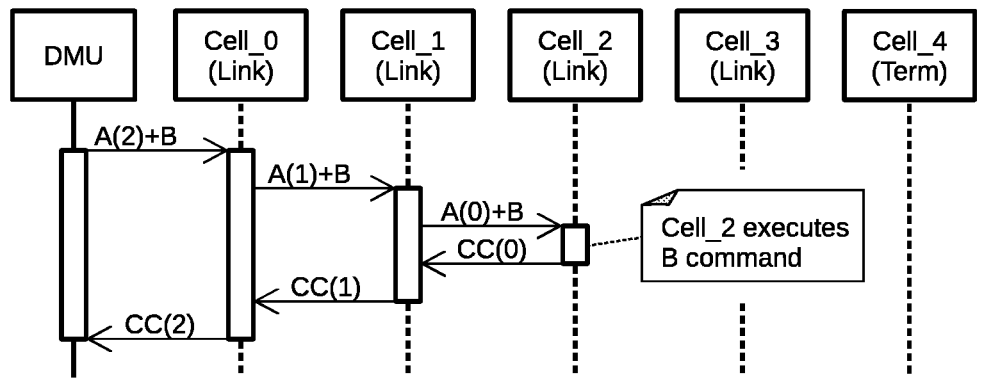
FIG. 18A is a sequence diagram of a first example of an addressing process.

FIG. 18A shows a first embodiment of the addressing process wherein the address and command are sent together. The process begins when the management unit sends an address 'A( )' and a command 'B' down the chain. (The '+' notation in FIG. 18A represents both elements being part of the same data packet, not numerical addition.) Each link cell that receives an address that is not equal to a predetermined value responds by: modifying the address by adding a predetermined offset to it, and forwarding the modified address and command down the chain. The cell that receives an address equal to the predetermined value executes the command. For example, in FIG. 18A the predetermined value is 0, and the predetermined offset is −1. The DMU sends an address of '2' down to Cell_0; Cell_0 decrements the address and passes it down to Cell_1; Cell_1 also decrements the address and passes it down to Cell_2; finally, Cell_2 receives an address of '0' and in response it executes the command. Then, typically the cell that executed the command initiates the cell count process, thereby giving the DMU confirmation that the targeted cell received and executed the command.

Figure 18B:
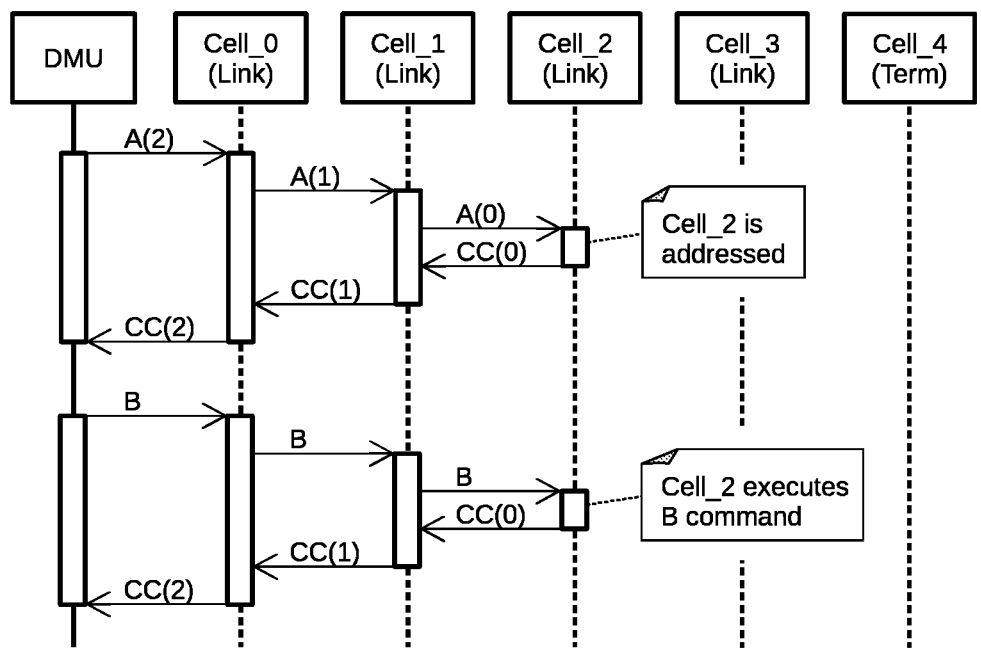
FIG. 18B is a sequence diagram of a second example of the addressing process.

FIG. 18B shows a second embodiment of the addressing process wherein the address and command are sent separately. The process begins with the DMU sending just the address down the chain. As before, each link cell adds a predetermined offset (typically −1) to the address and passes in down the chain, until the targeted cell (Cell_2 in this example) receives an address equal to the predetermined value (typically 0). In response, the targeted cell sets an internal address flag signifying that it is addressed for subsequent command execution. Then, typically the target cell initiates the cell count process to give the DMU confirmation that the intended target cell has been successfully addressed, which also signals the DMU to send the command 'B'. Each link cell that did not set its addressed bit simply passes the command down the chain until it reaches the targeted cell. In response to receiving the command whilst its address bit is set, the targeted cell executes the command. And typically, the targeted cell once again initiates the cell count process, this time giving the DMU confirmation that the command was executed by the intended target cell.

Figure 19:
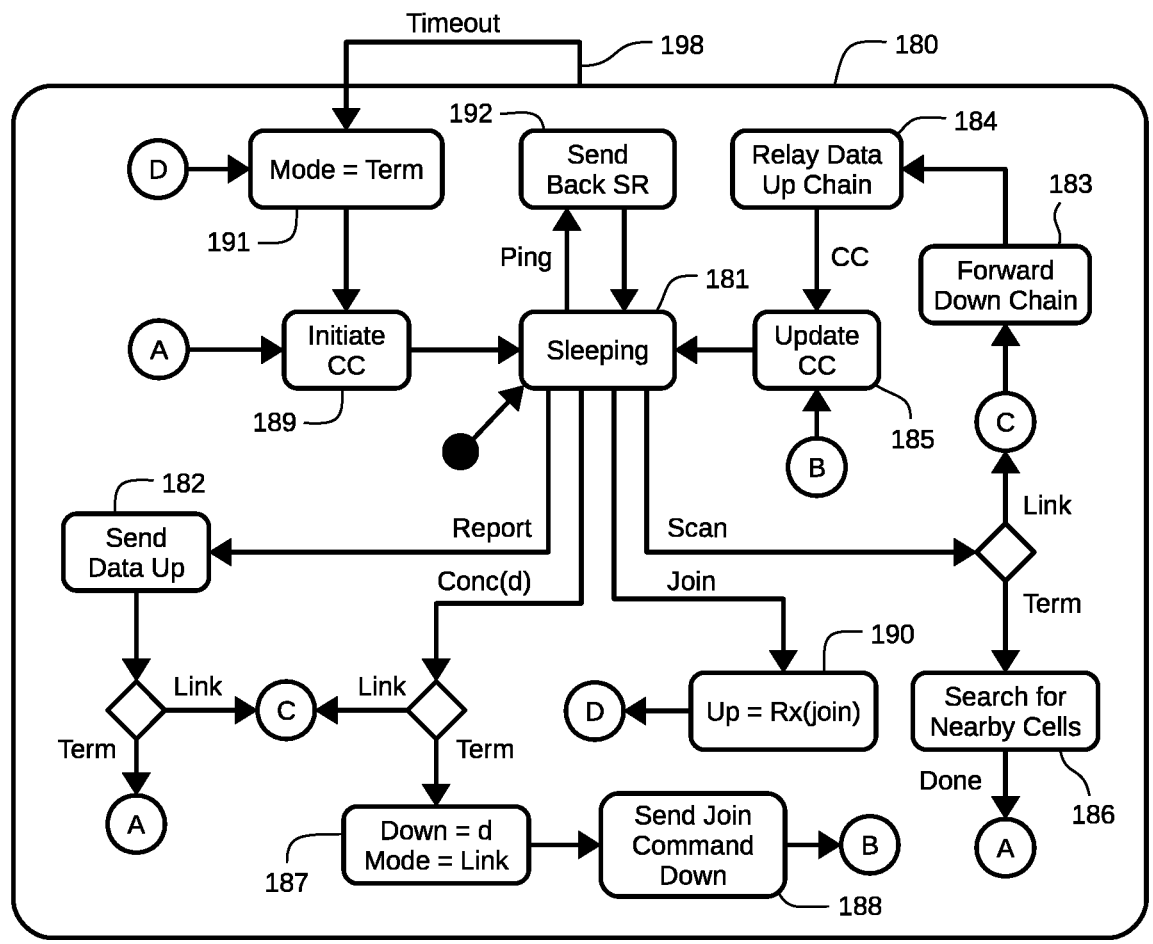
FIG. 19 is a simplified high-level state diagram of the method of operation for a smart cell.
Figure 20A:
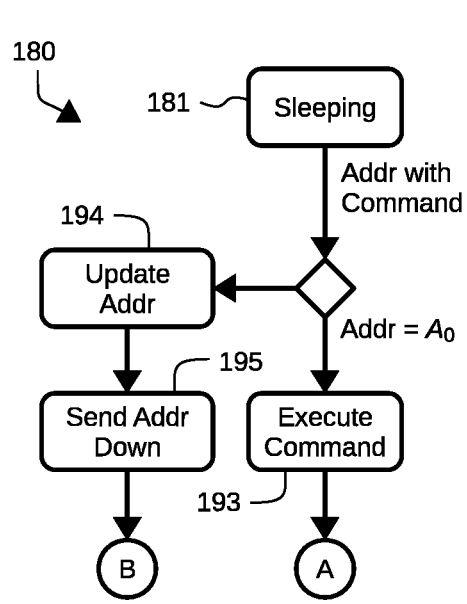
FIG. 20A is a state diagram of a first method for addressing a particular cell.
Figure 20B:
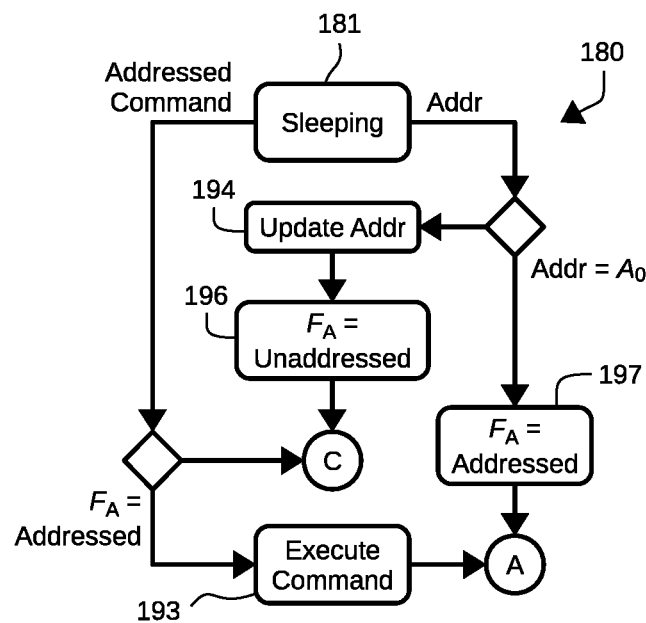
FIG. 20B is a state diagram of a second method for addressing a particular cell.

FIG. 19 is a simplified top-level state diagram of the method of operation 180 for an individual smart cell, and FIGS. 20A-B are low-level state diagrams of the two alternative methods for addressing a particular cell. The smart cell is normally in the sleeping state 181 until it receives a command; then it wakes up, responds to the command, and eventually goes back into the sleeping state. To make the state diagrams more readable, the commands have been divided into categories. The basic commands (reporting, concatenating, joining, scanning, and acknowledging) are handled in FIG. 19, while commands that apply to an addressed cell are handled by FIG. 20A-B. Additionally, there are typically other, optional commands that are not shown, such as: a reset command; and a command for reading back at least some of the internal settings.

Each smart cell maintains several internal settings (state variables) that govern its behavior including: the up and down direction codes; and the mode setting that configures the smart cell as either a link or termination cell. Each smart cell may also include: an address flag that determines if the cell is addressed or unaddressed; and another setting that controls the balance switch 50.

The smart cell method 180 comprises reporting in response to receiving a report command. The reporting step comprises sending 182 the data related to the energy storage state in the up direction. If the mode is in the link state then the reporting step further comprises: forwarding 183 the report command in the down direction; and relaying 184, wherein information is received from the down direction and sent in the up direction.

The smart cell method 180 comprises concatenating, wherein the down-direction code is determined in response to receiving a concatenation command 'Conc( )' and a related direction code 'd'. If the mode is in the link state then the concatenating step forwards 183 concatenation command is sent in the down direction, and relays 184 by receiving information from the down direction and sending in the up direction. Else, if the mode is in the termination state, then the concatenating step sets 187 the down-direction code to the related direction code 'd', sets the mode to the link state, and invites 188 a nearby cell with a join command sent in the down direction.

The smart cell method 180 comprises joining, wherein a join command is received and in response the smart cell sets 190 the up-direction code to the direction 'Rx(join)' from which the join command was received, and sets 191 the mode to the termination state.

The smart cell method 180 comprises scanning for other smart cells within communication range in response to receiving a scan command. If the mode is in the link state then the smart cell forwards 183 the scan command in the down direction, and relays 184 by receiving information from the down direction and sending in the up direction. Else, if the mode is in the termination state, then the smart cell searches 186 by scanning through a plurality of directions and for each scan direction performing steps of: sending a ping command in the scan direction, listening for an acknowledgment to the ping command from the scan direction within a predetermined time limit, and sending information including the scan direction (the long response, LR) in the up direction in response to each received acknowledgment.

The smart cell method 180 comprises acknowledging 192 in response to receiving a ping command by sending at least an acknowledgment (and typically the short response, SR) in the direction from which the ping command was received.

Addressed commands can be processed in two ways. First, as stated previously in regard to FIG. 18A, sometimes an address can be combined with the command so the smart cells receive them both together. In such cases FIG. 20A shows that when the received address (Addr) equals the predetermined value ($A_O$) the smart cell executes 193 the associated command. But when the received address does not equal the predetermined value the smart cell: updates 194 the address by adding in a predetermined offset to it; and sends 195 the updated address and associated command in the down direction. Furthermore, if the command is executed, the smart cell typically initiates 189 the cell count before going back to sleep. Similarly, if the command is forwarded down the chain, the smart cell typically waits to receive a cell count and updates 185 it before going back to sleep.

The second way to process addressed commands, as stated previously in regard to FIG. 18B, handles the address and command separately. In such cases FIG. 20B shows that the smart cell sets 197 the address flag to the addressed state if the received address (Addr) equals the predetermined value ($A_O$). But when the received address does not equal the predetermined value, the smart cell: updates 194 the the address by adding the predetermined offset to it, sets 196 the address flag ($F_A$) to the unaddressed state, and forwards 183 the updated address in the down direction. Subsequently, in response to receiving the addressed command from the up direction the smart cell responds by executing 193 the command if the address flag is in the addressed state, otherwise forwarding 183 the command in the down direction.

The cell method 180 also typically includes steps of: initiating 189 the cell count process by sending a predetermined initial cell count in the up direction; and receiving a cell count from the down direction and in response updating 185 the cell count by adding a predetermined offset to it and sending the updated cell count in the up direction.

And finally, FIG. 19 shows how the cell method 180 implements the truncation process that was described above in relation to FIG. 15. A timeout 198 occurs when the smart cell does not receive any communications within a predetermined time limit, and in response to the timeout the smart cell changes 191 its mode to the termination state, and then typically initiates 189 the cell count.

What is claimed is:

1. A method of managing an electrical energy storage system, comprising steps of:
    operating a plurality of smart cells in either a link mode or a termination mode within a two-dimensional array, with each smart cell communicating wirelessly with another smart cell in a manner that is relatively directional, the direction being electronically-steerable in a plane of the two-dimensional array;
    organizing the smart cells into a plurality of chains, each chain being a serially-linked wireless network having a first smart cell therein being in communication with a management unit for controlling and monitoring the smart cells and a second smart cell therein operating as a termination cell, wherein all smart cells in the respective chain other than the termination cell operate as link cells, the organizing step including the steps of:
        assigning an up-direction code to each smart cell in each respective chain for at least sending and receiving information along the respective chain in a direction of the management unit; and
        assigning a down-direction code to each smart cell other than the termination cell for at least sending and receiving information along the respective chain in a direction of the termination cell; and
    operating the energy storage system in a repetitive loop, comprising the steps of:
        collecting a set of data produced by each of the plurality of smart cells in each of the plurality of chains, wherein each smart cell sends its set of data up chain, and each of the link cells relays the data set from other down-chain smart cells up chain; and
        analyzing the set of data from each of the plurality of smart cells to determine the overall status of the energy storage system.

2. The method of claim 1, wherein the organizing step includes the steps of planning a floor plan of the plurality of chains and building the chains in accordance with the floor plan.

3. The method of claim 2, wherein at least one of the management units includes a nonvolatile memory and the planning step includes the step of reading a predetermined floor plan from the nonvolatile memory.

4. The method of claim 2, wherein the planning step includes adding one or more new smart cells positioned within a communication range of the termination cell in one of the plurality of chains, including the steps of:
    scanning for the one or more new smart cell within the communication range of the termination cell;
    reporting a direction code for each of the one or more new smart cells up the respective chain to the respective management unit;
    adding the new smart cell to the floor plan;
    selecting one of the one or more new smart cells for concatenation to the respective chain;
    sending a direction code for the selected new smart cell from the management unit down the chain to the termination cell;
    setting a down-direction of the termination cell to the direction code received by the termination cell from the management unit;
    sending a join command from the termination cell to the selected new smart cell;
    changing the termination cell to one of the link cells;
    setting an up-direction of the selected new smart cell to point in the direction from which it received the join command; and
    setting the selected new smart cell as the termination cell.

5. The method of claim 4, wherein the planning step reiterates the steps for adding one or more new smart cells until at least every smart cell on a perimeter of the array is included in the floor plan.

6. The method of claim 4, including the step of mapping a position of the one or more new smart cells in a set of estimated Cartesian coordinates.

7. The method of claim 6, wherein the planning step includes steps of:
    utilizing the set of estimated Cartesian coordinates for the one or more new smart cells to select a best-fit grid from a group consisting of a rectangular grid and a hexagonal grid; and
    correcting the set of estimated Cartesian coordinates of at least one of the one or more new smart cells to coincide with coordinates of the closest grid location.

8. The method of claim 4, wherein in response to any of the plurality of smart cells or the management unit being uncommunicative for a predetermined time limit, performing a recovery step comprising the steps of:
    exiting from the repetitive loop;
    removing the uncommunicative smart cell or the uncommunicative management unit from the floor plan;
    producing a modified floor plan;
    repeating the planning step for at least one chain; and
    returning to the repetitive loop.

9. The method of claim 1, wherein the repetitive loop includes the step of addressing a command to a selected smart cell within one of the plurality of chains.

10. The method of claim 9, including the step of charge balancing one or more of the plurality of the smart cells with charge balancing circuitry within the smart cells.

11. The method of claim 10, including the steps of selecting one or more of the plurality of the smart cells to have their charge balancing activated or deactivated and sending an activation signal or a deactivation signal to the selected smart cells.

12. The method of claim 9, wherein the addressing step includes steps for:
    sending an address and a command from the management unit down one of the plurality of chains;
    forwarding the address and the command, wherein when the address is not equal to a predetermined value at the respective smart cell, the smart cell responds by:
        updating the address by adding a predetermined offset, and
        sending the updated address and the command down the chain; and
    executing the command in the smart cell that receives the address equal to the predetermined value.

13. The method of claim 9, wherein each smart cell maintains an address flag setting with at least an addressed state and an unaddressed state, wherein the addressing step further includes the steps of:
    sending an address from the management unit down one of the plurality of chains;

forwarding the address, wherein when the address is not equal to a predetermined value at the respective smart cell, the smart cell responds by:

setting its address flag to the unaddressed state;

updating the address by adding a predetermined offset; and sending the updated address down the chain;

setting the address flag to the addressed state in the smart cell that receives an address equal to the predetermined value;

sending a command from the management unit down the chain;

forwarding the command, wherein each smart cell that has its address flag set to the unaddressed state sends the command down the chain; and executing the command in the smart cell that has its address flag set to the addressed state.

14. The method of claim 1, further including the steps of:

sending a predetermined initial cell count up the chain;

forwarding the cell count, wherein each smart cell that receives the cell count responds by:

updating the cell count by adding a predetermined offset, and sending the updated cell count up the chain; and receiving a final cell count in the management unit.

15. The method of claim 1, including the step of changing one of the link cells to the termination cell in response to the changed link cell not receiving communications from the down direction for a predetermined time limit.

16. The method of claim 1, wherein at least one management unit is in communication with a charge controller and the step of analyzing the data includes notifying the charge controller in response to the energy storage state of any smart cell reaching or exceeding a predetermined limit.

17. A method of managing an electrical energy storage system, the system comprising a plurality of smart cells operable in either a link mode or a termination mode and arranged into a two-dimensional array, each smart cell adapted to communicate wirelessly in a manner that is relatively directional with the direction being electronically-steerable in a plane of the two-dimensional array, the method comprising steps of:

organizing the smart cells into a plurality of chains, each chain being a serially-linked wireless network having a first smart cell therein being in communication with a management unit for controlling and monitoring the smart cells and a second smart cell therein operating as a termination cell, wherein all smart cells in the respective chain other than the termination cell operate as link cells, the organizing step including the steps of:

assigning an up-direction code to each smart cell in each respective chain for at least sending and receiving information along the respective chain in a direction of the management unit; and assigning a down-direction code to each smart cell other than the termination cell for at least sending and receiving information along the respective chain in a direction of the termination cell;

planning a floor plan of the plurality of chains, comprising the steps of:

adding one or more new smart cells positioned within a communication range of the termination cell in one of the plurality of chains;

scanning for the one or more new smart cell within the communication range of the termination cell;

reporting a direction code for each of the one or more new smart cells up the respective chain to the respective management unit;

adding the new smart cell to the floor plan;

selecting one of the one or more new smart cells for concatenation to the respective chain;

sending a direction code for the selected new smart cell from the management unit down the chain to the termination cell;

setting a down-direction of the termination cell to the direction code received by the termination cell from the management unit;

sending a join command from the termination cell to the selected new smart cell;

changing the termination cell to one of the link cells;

setting an up-direction of the selected new smart cell to point in the direction from which it received the join command; and setting the selected new smart cell as the termination cell;

building the chains in accordance with the floor plan; and operating the energy storage system in a repetitive loop, comprising the steps of:

collecting a set of data produced by each of the plurality of smart cells in each of the plurality of chains, wherein each smart cell sends its set of data up chain, and each of the link cells relays the data set from other down-chain smart cells up chain; and analyzing the set of data from each of the plurality of smart cells to determine the overall status of the energy storage system.

18. The method of claim 17, wherein at least one of the management units includes a nonvolatile memory and the planning step includes the step of reading a predetermined floor plan from the nonvolatile memory.

19. The method of claim 17, wherein the planning step reiterates the steps for adding one or more new smart cells until at least every smart cell on a perimeter of the array is included in the floor plan.

20. The method of claim 17, including the step of mapping a position of the one or more new smart cells in a set of estimated Cartesian coordinates.

21. The method of claim 20, wherein the planning step includes steps of:

utilizing the set of estimated Cartesian coordinates for the one or more new smart cells to select a best-fit grid from a group consisting of a rectangular grid and a hexagonal grid; and correcting the set of estimated Cartesian coordinates of at least one of the one or more new smart cells to coincide with coordinates of the closest grid location.

22. The method of claim 17, wherein in response to any of the plurality of smart cells or the management unit being uncommunicative for a predetermined time limit, performing a recovery step comprising the steps of:

exiting from the repetitive loop;

removing the uncommunicative smart cell or the uncommunicative management unit from the floor plan;

producing a modified floor plan;

repeating the planning step for at least one chain; and returning to the repetitive loop.

23. The method of claim 17, wherein the repetitive loop includes the step of addressing a command to a selected smart cell within one of the plurality of chains.

24. The method of claim 23, including the step of charge balancing one or more of the plurality of the smart cells with charge balancing circuitry within the smart cells.

25. The method of claim 24, including the steps of selecting one or more of the plurality of the smart cells to have their charge balancing activated or deactivated and sending an activation signal or a deactivation signal to the selected smart cells.

26. The method of claim 23, wherein the addressing step includes steps for:
sending an address and a command from the management unit down one of the plurality of chains;
forwarding the address and the command, wherein when the address is not equal to a predetermined value at the respective smart cell, the smart cell responds by:
updating the address by adding a predetermined offset, and
sending the updated address and the command down the chain; and
executing the command in the smart cell that receives the address equal to the predetermined value.

27. The method of claim 23, wherein each smart cell maintains an address flag setting with at least an addressed state and an unaddressed state, wherein the addressing step further includes the steps of:
sending an address from the management unit down one of the plurality of chains;
forwarding the address, wherein when the address is not equal to a predetermined value at the respective smart cell, the smart cell responds by:
setting its address flag to the unaddressed state;
updating the address by adding a predetermined offset; and
sending the updated address down the chain;
setting the address flag to the addressed state in the smart cell that receives an address equal to the predetermined value;
sending a command from the management unit down the chain;
forwarding the command, wherein each smart cell that has its address flag set to the unaddressed state sends the command down the chain; and
executing the command in the smart cell that has its address flag set to the addressed state.

28. The method of claim 17, further including the steps of:
sending a predetermined initial cell count up the chain;
forwarding the cell count, wherein each smart cell that receives the cell count responds by:
updating the cell count by adding a predetermined offset;
sending the updated cell count up the chain; and
receiving a final cell count in the management unit.

29. The method of claim 17, including the step of changing one of the link cells to the termination cell in response to the changed link cell not receiving communications from the down direction for a predetermined time limit.

30. The method of claim 17, wherein at least one management unit is in communication with a charge controller and the step of analyzing the data includes notifying the charge controller in response to the energy storage state of any smart cell reaching or exceeding a predetermined limit.

* * * * *